United States Patent [19]

Miyama et al.

[11] Patent Number: 5,416,717
[45] Date of Patent: May 16, 1995

[54] CIRCUIT SIMULATION METHOD FOR A CIRCUIT REALIZED BY AN LSI LAYOUT PATTERN BASED UPON A CIRCUIT OF A LOGIC GATE LEVEL REALIZED BY THE LAYOUT PATTERN

[75] Inventors: Mikako Miyama, Hachioji; Goichi Yokomizo, Tokyo; Chikako Yoshida, Higashikurume, all of Japan

[73] Assignee: Hitachi, Ltd., Tokyo, Japan

[21] Appl. No.: 577,434

[22] Filed: Sep. 4, 1990

[30] Foreign Application Priority Data

Sep. 6, 1989 [JP] Japan .................................. 1-229150
Sep. 14, 1989 [JP] Japan .................................. 1-237050

[51] Int. Cl.$^6$ .......................................... G06F 15/60
[52] U.S. Cl. ..................................... 364/488; 364/578
[58] Field of Search ............... 364/488, 489, 490, 491, 364/578; 371/23

[56] References Cited

U.S. PATENT DOCUMENTS

| T943,001 | 2/1976 | Mennone | 364/490 |
|---|---|---|---|
| T944,001 | 3/1976 | Hanan et al. | 364/490 |
| 4,896,272 | 1/1990 | Kurosawa | 364/491 |
| 4,939,681 | 7/1990 | Yokomizo et al. | 364/578 |
| 4,942,536 | 7/1990 | Watanabe et al. | 364/490 |
| 4,961,156 | 10/1990 | Takasaki | 364/578 |
| 5,051,938 | 9/1991 | Hyduke | 364/578 |
| 5,067,091 | 11/1991 | Nakazawa | 364/490 |
| 5,081,602 | 1/1992 | Glover | 364/578 |
| 5,084,824 | 1/1992 | Lam et al. | 364/490 |
| 5,105,374 | 4/1992 | Yoshida | 364/578 |

OTHER PUBLICATIONS

"Programs for Verifying Circuit Connectivity of MOS/LSI Mask Artwork" by M. Takashima et al., IEEE 19th D.A. Conf., pp. 544–550, 1982.

"Automated Extraction of SPICE Circuit Models from Symbolic Gate Matrix Layout with Prunting" by R. D. Freeman et al., IEEE 1986, 23rd D.A. Conf., pp. 418–424.

"EXCL: A Circuit Extractor for IC Designs" by S. P. McCormick, IEEE 1984, 21st Design Automation Conf., pp. 616–623.

"Resistance Extraction in a Hierarchical IC Network Verification System" by S. Mori et al., IEEE 1985, pp. 196–198.

"PANAMAP-B: A Mask Verification System for Bipolar IC" by J. Yoshita et al., IEEE 1981, 18th Design Automation Conf., pp. 690–695.

"Methods Used in an Automatic Logic Design Generator (ALERT)" by T. D. Friedman et al., IEEE Trans. on Computers, vol. C-18, No. 7, Jul. 1969, pp. 593–614.

Primary Examiner—Vincent N. Trans
Attorney, Agent, or Firm—Antonelli, Terry, Stout & Kraus

[57] ABSTRACT

In verifying an LSI layout pattern, the whole layout pattern is converted into circuit data and a subcircuit to be verified is picked up and subjected to simulation. After converting the layout pattern into the transistor level circuit data, the transistor level circuit data is transformed into a logic gate level circuit data while judging a clocked gate included in the subcircuit. After picking up a subcircuit in a predetermined manner, an approximate load is connected to the interface port of the picked-up subcircuit.

26 Claims, 39 Drawing Sheets

FIG. 23a
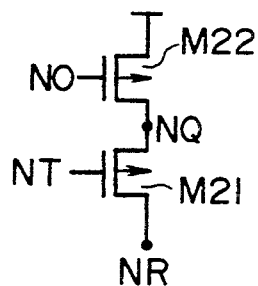
FIG. 23b
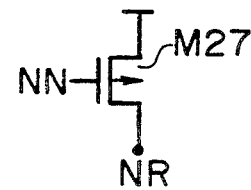
FIG. 23c
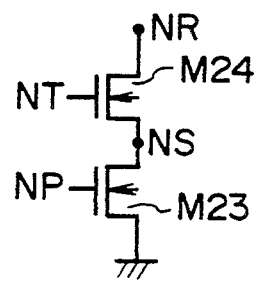
FIG. 23d
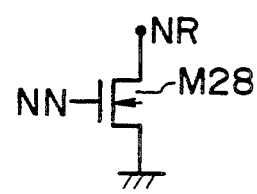
FIG. 24a    FIG. 24b    FIG. 24c
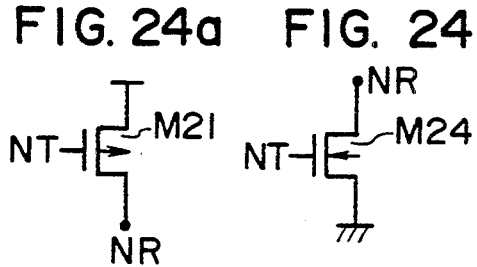
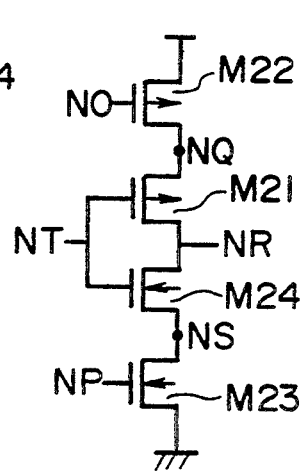
FIG. 25
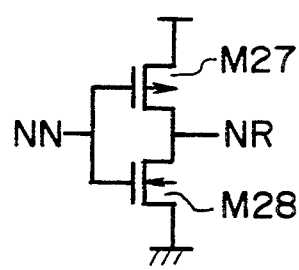

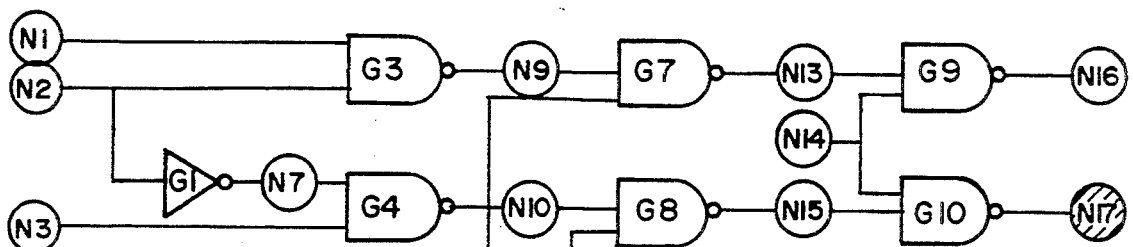
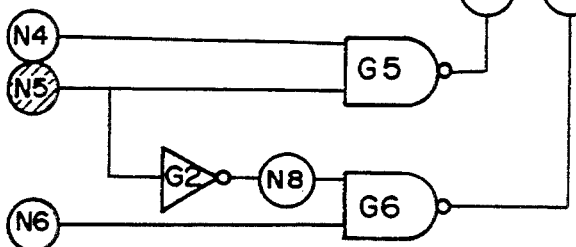
FIG. 29
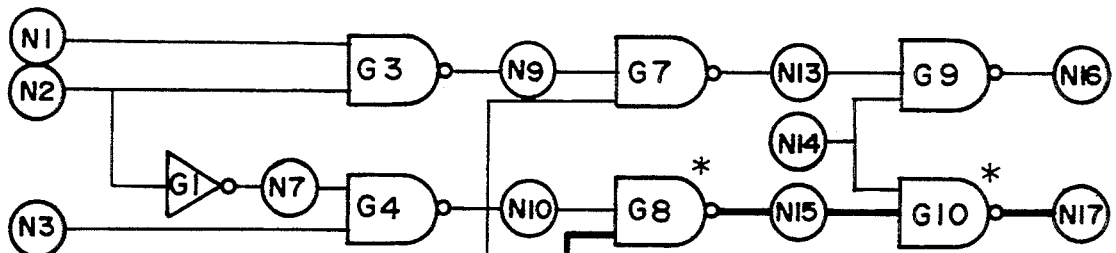
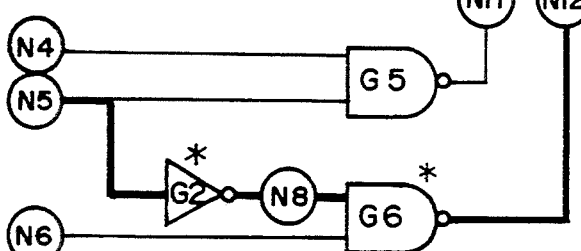
FIG. 30
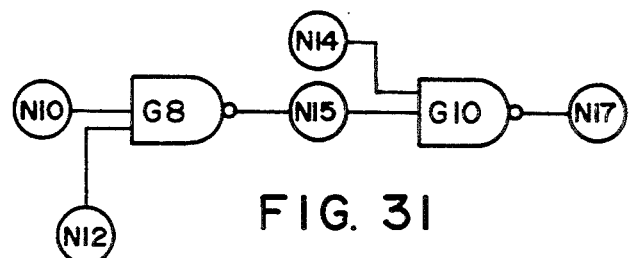
FIG. 31
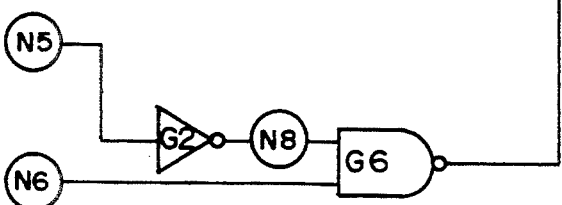

FIG. 32a

| NET NO. i | INPUT LOGIC GATE NUMBER NIi | OUTPUT LOGIC GATE NUMBER NOi | TABLE(b) POINTER Pi |
|---|---|---|---|
| N1  | 1 | 0 | 1 |
| N2  | 2 | 0 | 2 |
| N3  | 1 | 0 | 4 |
| N4  | 1 | 0 | 5 |
| N5  | 2 | 0 | 6 |
| N6  | 1 | 0 | 8 |
| N7  | 1 | 1 | 9 |
| N8  | 1 | 1 | 11 |
| N9  | 1 | 1 | 13 |
| N10 | 1 | 1 | 15 |
| N11 | 1 | 1 | 17 |
| N12 | 1 | 1 | 19 |
| N13 | 1 | 1 | 21 |
| N14 | 2 | 0 | 23 |
| N15 | 2 | 1 | 25 |
| N16 | 0 | 1 | 26 |
| N17 | 0 | 1 | 27 |

|  | LOGICAL GATE NO. |
|---|---|
| 1  | G3 |
| 2  | G1 |
| 3  | G3 |
| 4  | G4 |
| 5  | G5 |
| 6  | G2 |
| 7  | G5 |
| 8  | G6 |
| 9  | G4 |
| 10 | G1 |
| 11 | G6 |
| 12 | G2 |
| 13 | G7 |
| 14 | G3 |
| 15 | G7 |
| 16 | G5 |
| 17 | G8 |
| 18 | G7 |
| 19 | G8 |
| 20 | G6 |
| . | . |

FIG. 33
NET NO. j
| i \ j | N1 | N2 | N3 | N4 | N5 | N6 | N7 | N8 | N9 | N10 | N11 | N12 | N13 | N14 | N15 | N16 | N17 |
|---|---|---|---|---|---|---|---|---|---|---|---|---|---|---|---|---|---|
| G1 | 1 | | | | | | 2 | | | | | | | | | | |
| G2 | | | | 1 | | | 2 | | | | | | | | | | |
| G3 | 1 | 1 | | | | | | | 2 | | | | | | | | |
| G4 | ① | 1 | | | | 1 | | | | | 2 | | | | | | |
| G5 | | | 1 | 1 | | | | | | 2 | | | | | | | |
| G6 | | | | ① | 1 | | 1 | | | | | 2 | | | | | |
| G7 | ① | ① | | ① | ① | | | 1 | 1 | | | | 2 | | | | |
| G8 | ① | ① | | ① | ① | ① | ① | | | | 1 | 1 | | | 2 | | |
| G9 | ① | ① | | ① | ① | | | | ① | | | | 1 | 1 | | 2 | |
| G10 | ① | ① | | ① | ① | ① | ① | | ① | | ① | | | 1 | 1 | | 2 |
aij = 1   : NET NO. j IS AN INPUT TO LOGIC GATE NO. i
aij = 2   : NET NO. j IS AN OUTPUT FROM LOGIC GATE NO. i
aij = (VACANT) : NET NO. j IS NOT CONNECTED TO LOGIC GATE NO. i
aij = CIRCLED 1 : NET NO. j IS INDIRECT INPUT TO LOGIC GATE NO. i

FIG. 34

NET NO. j

|  j i | N1 | N2 | N3 | N4 | N5 | N6 | N7 | N8 | N9 | N10 | N11 | N12 | N13 | N14 | N15 | N16 | N17 |
|---|---|---|---|---|---|---|---|---|---|---|---|---|---|---|---|---|---|
| N1 | 1 |   |   |   |   |   |   | 1 |   |   |   | 1 |   |   | 1 |   |   |
| N2 |   | 1 |   |   |   | 1 | 1 |   | 1 |   | 1 |   | 1 |   | 1 | 1 | 1 |
| N3 |   |   | 1 |   |   |   |   |   |   |   | 1 |   |   |   | 1 |   | 1 |
| N4 |   |   |   | 1 |   |   |   | 1 |   |   | 1 | 1 |   |   | 1 | 1 |   |
| N5 |   |   |   |   | 1 |   | 1 |   | 1 |   | 1 | 1 |   | 1 | 1 |   | 1 |
| N6 |   |   |   |   |   | 1 | 1 |   |   |   |   | 1 |   |   | 1 | 1 |   |
| N7 |   |   |   |   |   |   | 1 | 1 |   |   |   |   |   |   | 1 | 1 |   |
| N8 |   |   |   |   |   |   |   | 1 | 1 |   |   |   |   |   | 1 | 1 | 1 |
| N9 |   |   |   |   |   |   |   |   | 1 |   |   |   | 1 |   | 1 | 1 |   |
| N10 |   |   |   |   |   |   |   |   |   | 1 |   |   | 1 | 1 |   | 1 | 1 |
| N11 |   |   |   |   |   |   |   |   |   |   | 1 |   |   |   |   |   | 1 |
| N12 |   |   |   |   |   |   |   |   |   |   |   | 1 | 1 |   |   |   | 1 |
| N13 |   |   |   |   |   |   |   |   |   |   |   |   | 1 |   |   | 1 | 1 |
| N14 |   |   |   |   |   |   |   |   |   |   |   |   |   | 1 | 1 |   | 1 |
| N15 |   |   |   |   |   |   |   |   |   |   |   |   |   |   | 1 | 1 |   |
| N16 |   |   |   |   |   |   |   |   |   |   |   |   |   |   |   | 1 |   |
| N17 |   |   |   |   |   |   |   |   |   |   |   |   |   |   |   |   | 1 |

$b_{ij} = 1$ : SIGNAL FLOW PATH FROM NET NO. i TO NET NO. j $b_{ij} = $ (VACANT) : NO SIGNAL FLOW PATH FROM NET NO. i TO NET NO. j

FIG. 43

(a1) BLOCK W1

| NET NO. i | INPUT LOGIC GATE NUMBER NIi | OUTPUT LOGIC GATE NUMBER NOi | TABLE(b1) POINTER Pi |
|---|---|---|---|
| NA1 | 1 | 0 | 1 |
| NA2 | 2 | 0 | 2 |
| NA3 | 1 | 0 | 4 |
| NA4 | 1 | 1 | 5 |
| NA5 | 0 | 1 | 7 |
| NA6 | 0 | 1 | 8 |

(b1)

| | LOGIC GATE NO. |
|---|---|
| 1 | GA2 |
| 2 | GA1 |
| 3 | GA2 |
| 4 | GA3 |
| 5 | GA1 |
| 6 | GA3 |
| 7 | GA2 |
| 8 | GA3 |

(a2) BLOCK W2

| NET NO. i | INPUT LOGIC GATE NUMBER NIi | OUTPUT LOGIC GATE NUMBER NOi | TABLE(b2) POINTER Pi |
|---|---|---|---|
| NA1 | 1 | 0 | 1 |
| NA2 | 2 | 0 | 2 |
| NA3 | 1 | 0 | 4 |
| NA4 | 1 | 0 | 5 |
| NA5 | 1 | 0 | 6 |
| NA6 | 1 | 1 | 7 |
| NA7 | 1 | 1 | 9 |
| NA8 | 0 | 1 | 11 |
| NA9 | 0 | 1 | 12 |

(b2)

| | LOGIC GATE NO. |
|---|---|
| 1 | GB1 |
| 2 | GB3 |
| 3 | GB4 |
| 4 | GB2 |
| 5 | GB1 |
| 6 | GB2 |
| 7 | GB1 |
| 8 | GB3 |
| 9 | GB2 |
| 10 | GB4 |
| 11 | GB3 |
| 12 | GB4 |

(a3) BLOCK W3

| NET NO. i | INPUT LOGIC GATE NUMBER NIi | OUTPUT LOGIC GATE NUMBER NOi | TABLE(b3) POINTER Pi |
|---|---|---|---|
| NC1 | 1 | 0 | 1 |
| NC2 | 2 | 0 | 2 |
| NC3 | 1 | 0 | 4 |
| NC4 | 1 | 1 | 5 |
| NC5 | 0 | 1 | 7 |
| NC6 | 0 | 1 | 8 |

(b3)

| | LOGIC GATE NO. |
|---|---|
| 1 | GC2 |
| 2 | GC1 |
| 3 | GC2 |
| 4 | GC3 |
| 5 | GC1 |
| 6 | GC3 |
| 7 | GC2 |
| 8 | GC3 |

FIG. 44

(1) BLOCK W1

| i \ j | NA1 | NA2 | NA3 | NA4 | NA5 | NA6 |
|---|---|---|---|---|---|---|
| GA1 |   | 1 |   | 2 |   |   |
| GA2 | 1 | 1 |   |   | 2 |   |
| GA3 |   | ① | 1 | 1 |   | 2 |

LOGIC GATE NO. i / NET NO. j

(2) BLOCK W2

| i \ j | NB1 | NB2 | NB3 | NB4 | NB5 | NB6 | NB7 | NB8 | NB9 |
|---|---|---|---|---|---|---|---|---|---|
| GB1 | 1 |   |   | 1 |   | 2 |   |   |   |
| GB2 |   |   | 1 |   | 1 |   | 2 |   |   |
| GB3 | ① | 1 |   | ① |   | 1 |   | 2 |   |
| GB4 |   | 1 | ① |   | ① |   | 1 |   | 2 |

LOGIC GATE NO. i / NET NO. j

(3) BLOCK W3

| i \ j | NC1 | NC2 | NC3 | NC4 | NC5 | NC6 |
|---|---|---|---|---|---|---|
| GC1 |   | 1 |   | 2 |   |   |
| GC2 | 1 | 1 |   |   | 2 |   |
| GC3 |   | ① | 1 | 1 |   | 2 |

LOGIC GATE NO. i / NET NO. j $a_{ij} = 1$ : NET NO. j IS AN INPUT TO LOGIC GATE NO. i

$a_{ij} = 2$ : NET NO. j IS AN OUTPUT FROM LOGIC GATE NO. i

$a_{ij} =$ (VACANT) : NET NO. j IS NOT CONNECTED TO LOGIC GATE NO. i $a_{ij} =$ CIRCLED 1 : NET NO. j IS AN INDIRECT INPUT TO LOGIC GATE NO. i

FIG. 45

(1) BLOCK W1

NET NO. j

| i\j | NA1 | NA2 | NA3 | NA4 | NA5 | NA6 |
|---|---|---|---|---|---|---|
| NA1 | 1 |   |   |   | 1 |   |
| NA2 |   | 1 |   | 1 | 1 | 1 |
| NA3 |   |   | 1 |   |   | 1 |
| NA4 |   |   |   | 1 |   | 1 |
| NA5 |   |   |   |   | 1 |   |
| NA6 |   |   |   |   |   | 1 |

NET NO. i

(2) BLOCK W2

NET NO. j

| i\j | NB1 | NB2 | NB3 | NB4 | NB5 | NB6 | NB7 | NB8 | NB9 |
|---|---|---|---|---|---|---|---|---|---|
| NB1 | 1 |   |   |   |   | 1 |   | 1 |   |
| NB2 |   | 1 |   |   |   |   |   | 1 | 1 |
| NB3 |   |   | 1 |   |   |   | 1 |   | 1 |
| NB4 |   |   |   | 1 |   | 1 |   | 1 |   |
| NB5 |   |   |   |   | 1 |   | 1 | 1 | 1 |
| NB6 |   |   |   |   |   | 1 | 1 |   |   |
| NB7 |   |   |   |   |   |   | 1 |   | 1 |
| NB8 |   |   |   |   |   |   |   | 1 |   |
| NB9 |   |   |   |   |   |   |   |   | 1 |

NET NO. i

(3) BLOCK W3

NET NO. j

| i\j | NC1 | NC2 | NC3 | NC4 | NC5 | NC6 |
|---|---|---|---|---|---|---|
| NC1 | 1 |   |   |   | 1 |   |
| NC2 |   | 1 |   | 1 | 1 | 1 |
| NC3 |   |   | 1 |   |   | 1 |
| NC4 |   |   |   | 1 |   | 1 |
| NC5 |   |   |   |   | 1 |   |
| NC6 |   |   |   |   |   | 1 |

NET NO. i $b_{ij} = 1$ : SIGNAL FLOW PATH BETWEEN NET NO. i TO NET NO. j $b_{ij} = $ (VACANT) : NO SIGNAL FLOW PATH BETWEE NET NO. i TO NET NO. j

FIG. 46

| i \ j | NI1 | NI2 | NI3 | NI4 | NI5 | NI6 | NI7 | NI8 | NI9 | NI10 | NI11 | NI12 | NI13 |
|---|---|---|---|---|---|---|---|---|---|---|---|---|---|
| NI1 | 1 | | | | | | | | | | | | |
| NI2 | | 1 | | | | | | | | | | | |
| NI3 | | | 1 | | | | | | | | | | |
| NI4 | | | | 1 | | | | | | | | | |
| NI5 | | | | | 1 | | | | | | | | |
| NI6 | | | | | | 1 | 1 | | | | | | |
| NI7 | | | | | | 1 | 1 | | | | | | |
| NI8 | | | | | | | | 1 | | | | | |
| NI9 | | | | | | | | | 1 | | | | |
| NI10 | | | | | | | | | | 1 | 1 | | |
| NI11 | | | | | | | | | | | 1 | | |
| NI12 | | | | | | | | | | | | 1 | |
| NI13 | | | | | | | | | | | | | 1 |

$b_{ij} = 1$ : SIGNAL FLOW PATH BETWEEN NET NO. i TO NET NO. j $b_{ij} = $ (VACANT) : NO SIGNAL FLOW PATH BETWEEN NET NO. i TO NET NO. j

FIG. 48a

| NET NO. i | CONNECTED NET NUMBER Ci | TABLE (b) POINTER Pi |
|---|---|---|
| N1 | 4 | 1 |
| N2 | 8 | 5 |
| N3 | 4 | 13 |
| N4 | 4 | 17 |
| N5 | 8 | 25 |
| N6 | 4 | 33 |
| N7 | 4 | 37 |
| N8 | 4 | 41 |
| N9 | 3 | 45 |
| N10 | 3 | 48 |
| N11 | 3 | 51 |
| N12 | 3 | 54 |
| N13 | 2 | 57 |
| N14 | 3 | 59 |
| N15 | 2 | 62 |
| N16 | 1 | 64 |
| N17 | 1 | 65 |

FIG. 48b

| | | NET NO. j |
|---|---|---|
| P1 → | 1 | N1 |
| C1 | 2 | N9 |
| | 3 | N13 |
| | 4 | N16 |
| P2 → | 5 | N2 |
| C2 | 6 | N7 |
| | 7 | N9 |
| | 8 | N11 |
| | 9 | N13 |
| | 10 | N15 |
| | 11 | N16 |
| | 12 | N17 |
| P3 → | 13 | N3 |
| C3 | 14 | N11 |
| | 15 | N15 |
| | 16 | N17 |
| P4 → | 17 | N4 |
| C4 | 18 | . |
| | 19 | . |
| | | . |

FIG. 49

| i \ j | W1 | W2 | W3 |
|---|---|---|---|
| NI1 | NA1 | | |
| NI2 | NA2 | | |
| NI3 | NA3 | | |
| NI4 | | | NC1 |
| NI5 | | | NC2 |
| NI6 | | | NC3 |
| NI7 | NA5 | NB1 | |
| NI8 | | NB2 | |
| NI9 | NA6 | NB3 | |
| NI10 | | NB4 | NC5 |
| NI11 | | NB5 | NC6 |
| NI12 | | NB8 | |
| NI13 | | NB9 | |

BLOCK NO. j (column header)
INTERFACE NET NO. i (row header)

$c_{ij}$ = N__ : INTERFACE NO. i INCLUDES NET N__ WITHIN BLOCK NO. j $c_{ij}$ = (VACANT) : INTERFACE NO. i DOES NOT INCLUDE NET WITHIN BLOCK NO. j

FIG. 51a ELEMENT TABLE

| ELEMENT NO. | ELEMENT TYPE | PARASITIC ELEMENT IDENTIFIER | ELEMENT VALUE | TERMINAL TYPE | NODE TABLE POINTER | LOGIC GATE TABLE POINTER |
|---|---|---|---|---|---|---|
| 1 | PMOS | 0 | GATE LENGTH, GATE WIDTH, MODEL NAME | S | 1 | |
| | | | | G | 8 | |
| | | | | D | 10 | |
| | | | | B | 6 | |
| ≀ | ≀ | ≀ | ≀ | ≀ | ≀ | |
| 10 | R | 1 | 10.9 | IN | 8 | |
| | | | | OUT | 12 | |
| ≀ | ≀ | ≀ | ≀ | ≀ | ≀ | |

FIG. 51b NODE TABLE

| NODE NO. | POINTER NUMBER | CONNECTED ELEMENT POINTER | | | NET TABLE POINTER |
|---|---|---|---|---|---|
| 1 | 3 | 1 | 3 | 4 | |
| ≀ | ≀ | ≀ | | | |
| 8 | 3 | 10 | 11 | 20 | |
| ≀ | ≀ | ≀ | | | |

FIG. 52a LOGIC GATE TABLE

| 220 | 221 | 222 | 223 | 224 | 225 226 |
|---|---|---|---|---|---|---|

| LOGIC GATE NO. | LOGIC GATE TYPE | ELEMENT NUMBER | ELEMENT TABLE POINTER | TERMINAL TYPE | NET TABLE POINTER |
|---|---|---|---|---|---|
| 1 | NAND | 4 | 1 | IN 1 | 1 |
| | | | 10 | IN 2 | 5 |
| | | | 18 | OUT | 10 |
| | | | 30 | — | — |
| ⌇ | ⌇ | ⌇ | ⌇ | ⌇ | ⌇ |
| 12 | INV | 2 | 5 | IN | 15 |
| | | | 6 | OUT | 20 |
| ⌇ | ⌇ | ⌇ | ⌇ | ⌇ | ⌇ |

FIG. 52b NET TABLE

| NET NO. | POINTER NUMBER | POINTER TO NODES CONSTITUTING NET |||||||
|---|---|---|---|---|---|---|---|---|
| 1 | 3 | 1 | 5 | 10 | | | | |
| ⌇ | ⌇ | ⌇ | | | | | | |
| 12 | 2 | 8 | 12 | | | | | |
| ⌇ | ⌇ | ⌇ | | | | | | |

CIRCUIT SIMULATION METHOD FOR A CIRCUIT REALIZED BY AN LSI LAYOUT PATTERN BASED UPON A CIRCUIT OF A LOGIC GATE LEVEL REALIZED BY THE LAYOUT PATTERN

BACKGROUND OF THE INVENTION

The present invention relates to a verification method for an LSI layout pattern using circuit simulation. More particularly, this invention relates to a verification method for an LSI pattern suitable for circuit simulation by extracting subcircuits having clocked gates from a circuit to be verified.

In designing LSIs, it is important that any defect of the circuit performance should be detected and dealt with before a test chip is fabricated. In view of this, circuit data is extracted from a layout pattern and inputted to a circuit simulator. The amount of circuit data to be extracted becomes enormous as the circuit scale becomes large. If all the extracted circuit data is inputted to the circuit simulator, a very long computer processing time and a large amount of memory capacity is required for circuit simulation.

An example of a circuit simulation method is described in Proc. of IEEE, 23rd Design Automation Conference, 1986 pp. 418 to 424. With this method, the area of a subcircuit along a signal flow path on a layout pattern is designated for a combination of specific input signals, and the designated subcircuit performance is verified. The layout pattern within the designated area only is used for extracting the circuit data.

For verification using circuit data transformed from a layout pattern, it is necessary that a figure corresponding to a circuit element is extracted by means of a pattern operating on data of each layer of masks constituting a layout pattern transistor level circuit data is generated by checking the positions of respective elements, and the transistor level circuit data is transformed into the logic gate level circuit data. A circuit transformation method is known whereby MOS transistors sequentially connected via source or drain terminals between an output net to which the drain terminal of PMOS transistors and the drain terminal of NMOS transistors are connected and a power source net are bundled together as a group, and the function of logic gate of each group is checked. A conventional method of checking the function of a logic gate in a CMOS circuit is discussed in Proc. of IEEE, 19th Design Automation Conference, 1982, pp. 544 to 550. According to this method, it is checked if the connection between PMOS and NMOS transistors is complementary or not. The complementary connection between PMOS and NMOS transistors means the following connections. Namely, PMOS transistors are connected in parallel, and NMOS transistors are connected in series with gate terminals connected to the same net or nets to which the gate terminals of PMOS transistors are connected. Alternatively, PMOS transistors are connected in series, and NMOS transistors are connected in parallel with gate terminals connected to the same net or nets to which the gate terminals of PMOS transistors are connected. A group of n PMOS transistors connected in parallel and n NMOS transistors connected in series constitutes an n-input NAND. A group of n PMOS transistors connected in series and n NMOS transistors connected in parallel constitutes an n-input NOR. A group of one PMOS transistor and one NMOS transistor constitutes an inverter.

SUMMARY OF THE INVENTION

For the conventional method which designates the area of a layout pattern to be extracted, it is necessary to know beforehand a correspondence between patterns and circuits, thereby posing problems of long processing time and many errors. Furthermore, parasitic capacitance between the picked-up circuit portion and the remaining circuit portion is neglected so that high precision circuit simulation is impossible.

In the conventional method which transforms a transistor level circuit to a logic gate level circuit, there are not considered two or more clocked gates having a common output net in a CMOS logic circuit, and one or more clocked gate and one logic gate other than the clocked gate respectively having a common output net. Accordingly, if some logic gates have a common output net, PMOS and NMOS transistors constituting respective logic gates and connected via their source or drain terminals between the output net and the power source net are bundled together as the same group. Therefore, one group has a plurality of logic gates and the function of the group cannot be identified.

It is an object of this invention to provide an efficient verification method for an LSI layout pattern through circuit simulation by restoring a transistor level circuit data from the layout pattern, recognizing each logic gate from a circuit including a clocked gate which has been considered difficult heretofore, and extracting the circuit data only along a signal flow path necessary for the circuit simulation.

In extracting the circuit data along a signal flow path necessary for circuit simulation, the present invention applies the method whereby a transistor level circuit data is restored from the whole layout pattern, and thereafter the area of the circuit necessary for the simulation is designated to pick up a subcircuit from the whole circuit. Furthermore, in order to take into consideration the parasitic capacitance between the picked-up circuit portion and the remaining circuit portion, an approximate load is added to the interface port of the picked-up circuit portion.

As the method of designating a subcircuit, one of the following methods can be selectively used, which includes (1) designation by a signal flow path unit, (2) designation by a logic gate unit, and (3) designation by a block unit. The three methods of designating a subcircuit will be described below.

(1) Designation by a signal flow path unit: the pickup processing for designating a circuit to be picked up by a signal flow path unit such as a critical signal flow path is constructed of the following seven steps.

(a) An incidence information table for nets and logic gates is formed while referring to circuit data. A term "net" herein used means a collection of nodes which take the same potential when parasitic elements are removed.

(b) The connection between nets is detected in accordance with the incidence information table for nets and logic gates.

(c) Nets constituting a signal flow path are detected.

(d) Logic gates constituting the signal flow path are detected.

(e) Nets connected to the logic gates are detected.

(f) All elements connected to the nets are picked up.

(g) Elements connected between the nets at the interface port and the nets included within the left circuit portion are classified into resistive elements and capacitive elements at the interface port in accordance with the type of elements or the connection conditions. A resistive element is removed, and a capacitive element is grounded or connected to the power source at its one node. Specifically, if a resistor in an open state is being connected, it is removed, whereas if a capacitor in an open state is being connected, the terminal of the capacitor not connected to the subcircuit is grounded. If a diode in an open state is being connected, it is removed. If a MOS transistor is being connected whose gate is connected to the picked-up circuit and at least one of whose source and drain is in an open state, it is transformed into a MOS capacitor by connecting the source and drain to the ground potential in case of an NMOS transistor or by connecting the source and drain to the high potential power source in case of a PMOS transistor. If a MOS transistor is being connected whose gate is not connected to the picked-up circuit, it is removed. If a bipolar transistor is being connected at least one of whose collector, base and emitter is in an open state, it is removed. With the above-described procedure, the interface port of the picked-up circuit is replaced with an approximate load.

(2) Designation by a logic gate unit: the pickup processing for designating a circuit to be picked up by a logic gate unit is constructed of the following five steps.
  (a) An incidence information table for nets and logic gates is formed while referring to circuit data.
  (b) It is checked if logic gates to be picked up have been designated.
  (c) If logic gates have been designated, nets connected to the designated logic gates are detected.
  (d) All elements connected to the nets are picked up.
  (e) Elements connected to the nets at the interface port are processed in the same manner as described at (g) of (1).

(3) Designation by a block unit: In the case of the large scaled circuit, it is impossible to collectively process and store the circuit data because of restrictions on computer processing time and memory capacity. In view of this, logic gates are bundled together into a block which is a collection of logic gates constituting a certain function. The pickup processing using designation by such a block unit is constructed of the following five steps.
  (a) An incidence information table for nets and logic gates is formed while referring to circuit data.
  (b) It is checked if logic gates are included in the picked-up block.
  (c) Nets connected to the logic gates within the picked-up block are detected.
  (d) All elements connected to the nets are picked up.
  (e) Elements connected to the nets at the interface port are processed in the same manner as described at (g) of (1).

According to the present invention, by discriminating the function of a transistor level circuit, the transistor level circuit data is transformed into a logic gate level circuit data. In the following, a method will be described for discriminating the function of a CMOS logic circuit including a clocked gate.

First, a plurality of PMOS or NMOS transistors constituting a signal flow path from an output net to a power source net via the source or drain terminal are bundled together into a PMOS transistor group and an NMOS transistor group. Of these PMOS transistor groups and NMOS transistor groups, if there are groups having the same MOS transistor, these groups are collectively bundled together into a single PMOS transistor group or a single NMOS transistor group. This procedure is repeated until all groups become as having no same MOS transistor. A combination of PMOS and NMOS transistor groups may constitute a clocked gate. However, if MOS transistors to which a clock signal is inputted are not removed, the connection between PMOS and NMOS transistors does not become complementary. The clocked gate design scheme is referred in order to obtain the disposal information of MOS transistors with a clock signal being inputted. If MOS transistors to which a clock signal is inputted are connected in series from the output net via the source or drain terminal, the output net is used as the object net. If MOS transistors to which a clock signal is inputted are connected in series from the power source net via the source or drain terminal, the power source net is used as the object net. By sequentially removing one after another the PMOS and NMOS transistors connected in series from the object net. PMOS and NMOS transistor groups whose connection is complementary can be found. These MOS transistors are judged as a subcircuit constituting a clocked gate. These PMOS and NMOS groups and the removed PMOS and NMOS transistors are collectively bundled together into a single group. After executing this procedure, if the connection is complementary between PMOS and NMOS transistors of the left subcircuit within the group which was not judged as the subcircuit constituting the clocked gate by the procedure, these PMOS and NMOS transistors of the left subcircuit is judged as a subcircuit constituting a logic gate other than the clocked gate, and this logic gate is regarded as a single group.

According to the present invention, after circuit data is extracted from the whole layout pattern, a subcircuit is picked up. Accordingly, it is not necessary to know beforehand a correspondence between the circuit and the layout pattern. Furthermore, circuit simulation is possible while considering all parasitic capacitors between the picked-up circuit portion and the left circuit portion, thereby allowing high precision circuit simulation.

Furthermore, MOS transistors including a clocked gate are divided into groups and the function of each group can be discriminated, thereby allowing an efficient circuit pickup while considering a clock signal.

BRIEF DESCRIPTION OF THE DRAWINGS

FIGS. 23A–23D show transistors constituting the group shown in FIG. 22b.

FIGS. 24A–24C show a combination of transistors shown in FIGS. 23a and 23c removing MOS transistors connected to the power source net.

FIG. 25 is a circuit diagram of the group shown in FIG. 22b removing the circuit portion constituting the clocked gate.

FIGS. 29, 36, 39 and 42 are circuit diagrams of the circuits before a subcircuit is picked up.

FIGS. 30 and 47 are circuit diagrams illustrating that logic gates and nets constituting a signal flow path are detected.

FIG. 31 is a circuit diagram showing a picked-up signal flow path.

FIGS. 32A, 32B and 43 show the structure of circuit data extracted from the layout pattern.

FIGS. 33 and 44 show the structure of connection data between nets and logic gates.

FIGS. 34, 45, 48A and 48B show the structure of connection and signal flow path direction data between nets.

FIG. 46 illustrates the data structure of the connection and signal flow path direction between interface nets.

FIG. 49 shows the correspondence between interface nets and nets within a block.

FIGS. 51A and 51B diagram representing the transistor level circuit data 3 in the table format.

FIGS. 52A and 52B diagram representing the logic gate level circuit data 3a in the table format.

DESCRIPTION OF THE PREFERRED EMBODIMENTS

Figure 1:
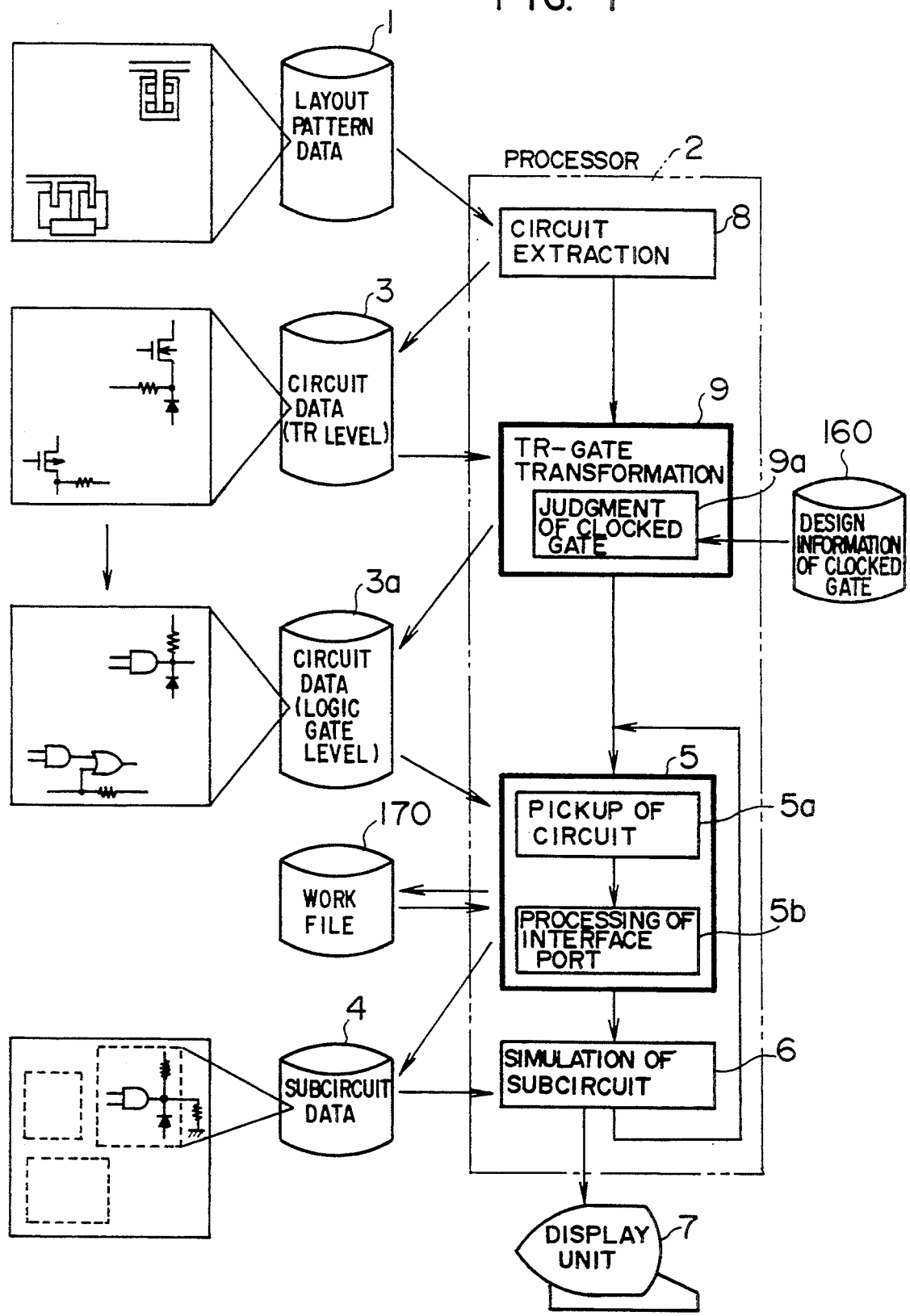
FIG. 1 is a block diagram illustrating the entirety of programs executing the verification method for an LSI layout pattern according to the present invention.

FIG. 1 is a block diagram showing the entirety of programs executing the LSI layout pattern verification method of this invention. The programs run on a processor 2.

The outline of the procedure of the layout pattern verification method of this invention will be described with reference to FIG. 1.

A circuit extraction processing 8 is carried out by recognizing each figure corresponding to a circuit element from data 1 representing a layout pattern to be verified, to thereby output a transistor level circuit data 3.

While judging (9a) a clocked gate, the transistor level circuit data 3 is transformed (9) into a logic gate level circuit data 3a. In the clocked gate judgment processing (9a), clocked gate design information 160 is referred. The logic gate level circuit data 8a is constructed of the transistor level circuit data 3 and a function name of each logic gate at each circuit portion of the transistor level circuit.

A processing 5 is carried out for picking up a subcircuit necessary for simulation from the logic gate level circuit data 3a, to thereby output a subcircuit data 4.

In the subcircuit pickup processing 5, a subcircuit is picked up (5a) in accordance with a method designated previously, and an approximate load is added to the interface port of the picked-up subcircuit (5b).

Various tables generated upon execution of the pickup processing 5 are temporarily stored in a work file 170.

The subcircuit 4 is inputted to perform the simulation 6 of the subcircuit, the results being outputted to a display unit 7.

The processings 5 and 6 are repeated for different subcircuits to be simulated.

As described above, the characteristic feature of this invention resides in that in the layout pattern verification, the layout pattern is transformed into circuit data and thereafter a subcircuit necessary for the verification is picked up to perform circuit simulation.

In the embodiments given later, the description will be directed to the processing 9 of transforming the transistor level circuit data into the logic gate level circuit data while judging a clocked gate in a CMOS logic circuit, and to the circuit pickup processing 5 carried out by various designation methods.

The structure of the transistor level circuit data 3 inputted at the processing 9 is shown in FIG. 51. FIG. 51a shows an element table 200 which stores information on respective elements constituting a circuit, and FIG. 51b shows a node table 210 indicating the connection between elements.

The fields of the element table 200 will be described. An element number 201 is a serial number for identifying each element. An element type 202 is the information for discriminating the type of each element, such as PMOS transistor, resistor and the like. A parasitic element identifier 203 is the information for identifying whether an element in concern is a parasitic element or not. An element value 204 is an electric circuit constant of each element. An identifier for identifying a plurality of terminals of each element is stored in a terminal type 205. A node table pointer 206 indicates the storage position within the node table 210 where the number of the node connected to the terminal is stored. A logic gate table pointer 207 is the information for indicating the correspondence to be described later between a logic gate and each element, the value of the pointer being changed when the transistor level circuit data is transformed into the logic gate level circuit data.

The fields of the node table 210 will be described. A node number 211 is a serial number for identifying each node. A pointer number 212 indicates the number of elements connected to a node in concern. A pointer 213 indicates the storage position within the element table 200 where the information regarding an element connected to the node is stored. A net table pointer 214 is the information for indicating the correspondence to be described later between a net and nodes included in the net, the value of the pointer being changed when the transistor level circuit data is transformed into the logic gate level circuit data.

The connection between elements can be identified by the pointer 206 of the element table 200 and the pointer 213 of the node table 210.

Figure 2:
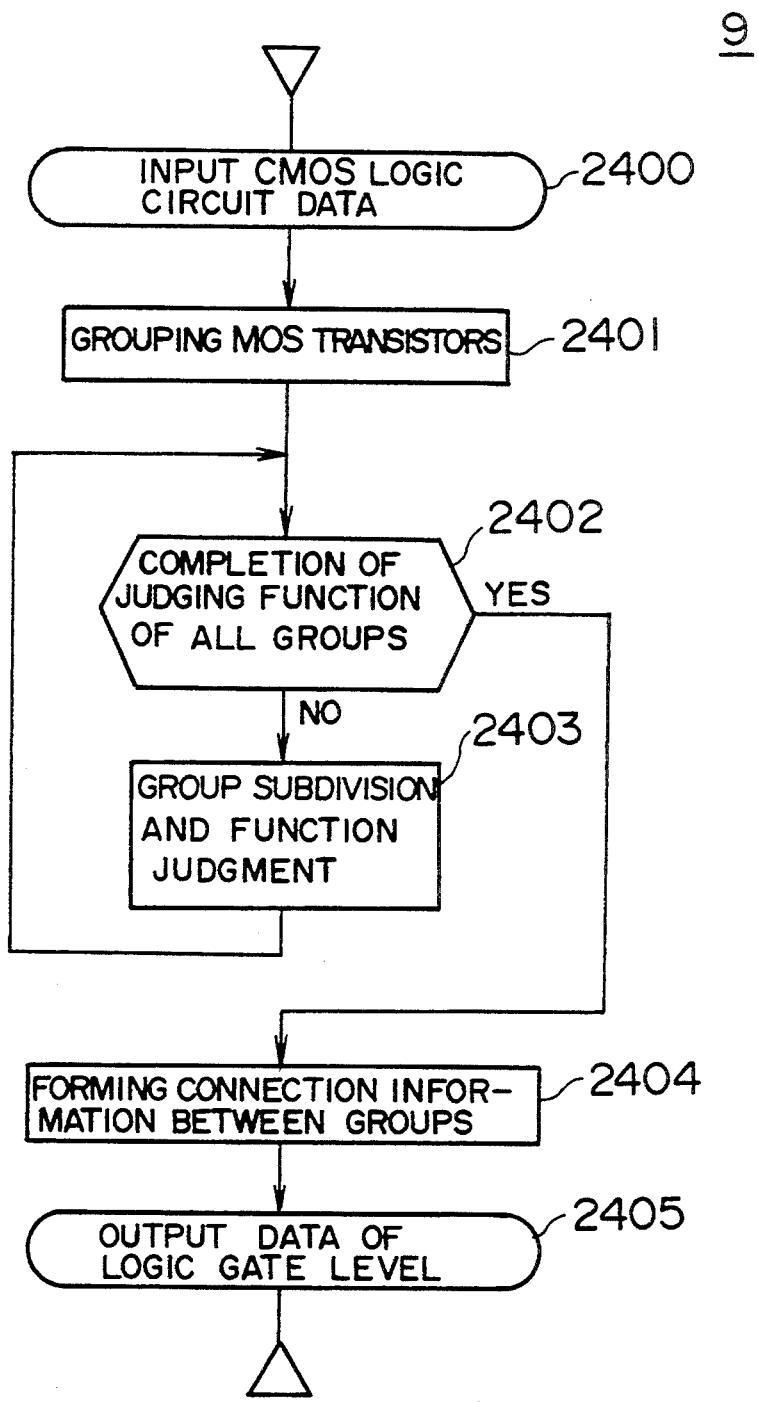
FIG. 2 is a flow chart showing the processing of transforming transistor connection data into logic gate connection data.

FIG. 2 is a flow chart illustrating the processing 9 of transforming the circuit data shown in FIG. 1 from the transistor level to the logic gate level.

First (at step 2400) the transistor level CMOS logic circuit data 3 is inputted. MOS transistors are divided into groups by using the CMOS logic circuit data (at step 2401). PMOS transistors or NMOS transistors having the source or drain terminals connected to the output net, or connected via the source or drain terminals to the power source net are bundled together in a group. Each group obtained (at step 2402) is subjected to a group subdivision and function judgment (at step 2403). After grouping MOS transistors (at step 2401), a plurality of logic gates may be included in the same group. Therefore, the group subdivision is carried out in order to make each logic gate belong to a different group. After completion of the function judgment, the connection information between groups is formed (at step 2404) and the logic gate level data is outputted (at step 2405).

Figure 3:
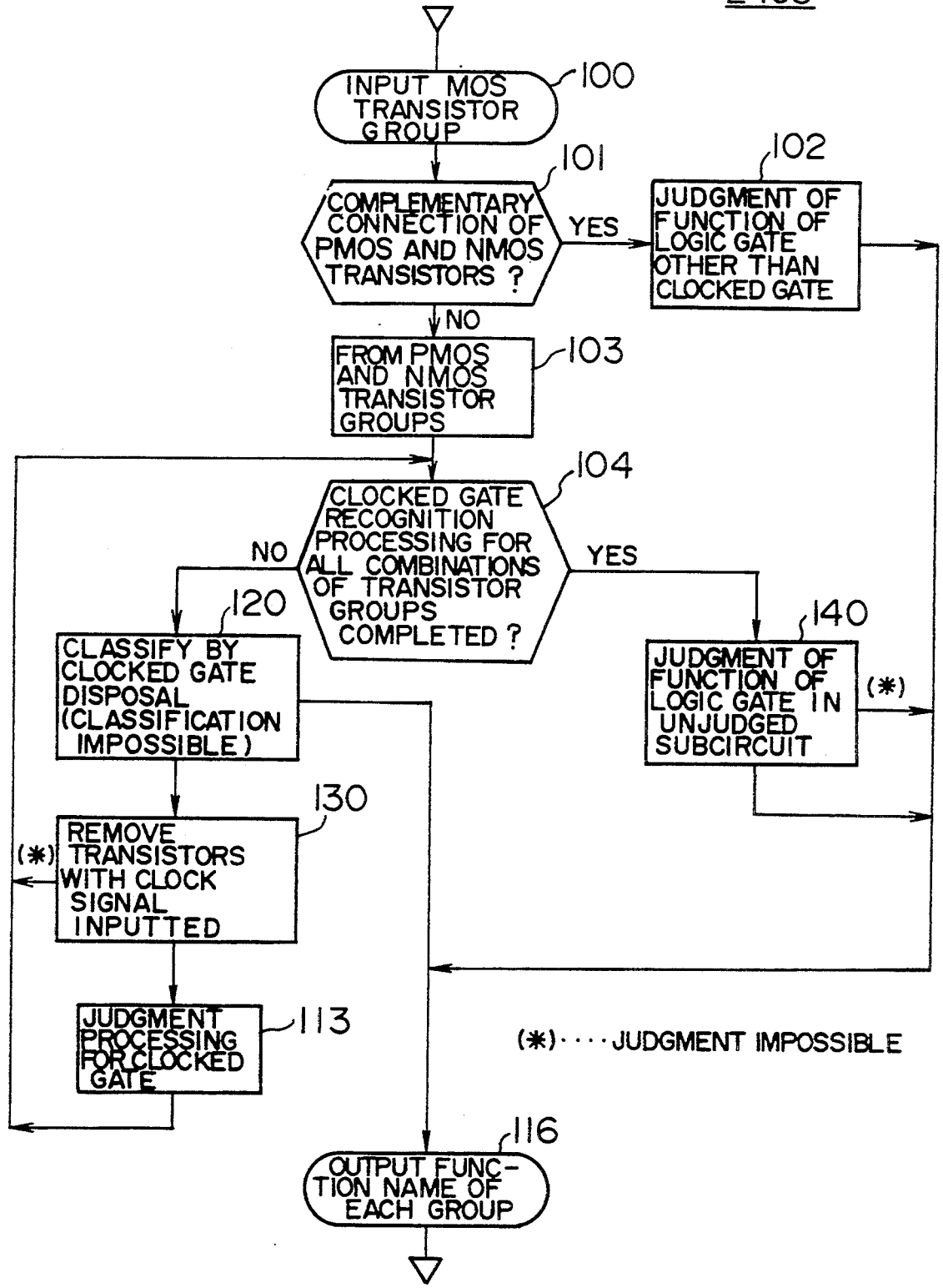
FIG. 3 is a flow chart briefly showing the group subdivision and function judging processing shown in FIG. 2.

Next, with reference to the flow charts shown in FIGS. 3 and 4, the operation of step (2403) shown in FIG. 2 will be described. First at step (100), one of MOS transistor groups obtained at step (2401) is inputted.

Next, the connection between PMOS and NMOS transistors is checked at step (101).

If the connection is complementary, a judgment is made at step (102) for judging a logic gate other than a clocked gate. At the judgment step (102) for judging a logic gate other than a clocked gate, complementary MOS transistors are recognized as a logic gate other than a clocked gate, and a function name is given thereto. The reason for this is that a logic gate other than a clocked gate in a CMOS logic circuit is a circuit constructed of PMOS and NMOS transistors whose connection is complementary. The complementary connection between PMOS and NMOS transistors means the case where PMOS transistors are connected in parallel and NMOS transistors are connected in series whose gate terminals are connected to the same net or nets to which the gate terminals of PMOS transistors are connected. Alternatively, it means the case where PMOS transistors are connected in series and NMOS transistors are connected in parallel whose gate terminals are connected to the same net or nets to which the gate terminals of PMOS transistors are connected. After step (102), step (116) is executed.

Figure 4A:
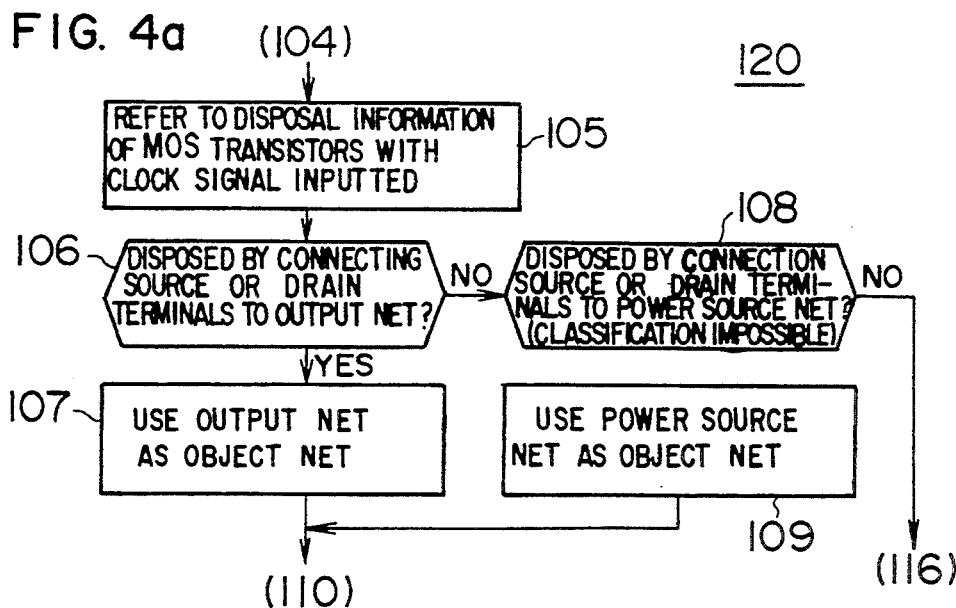
FIGS. 4A–4C are detailed flow chart of the group subdivision and function judging processing shown in FIG. 3.
Figure 4B:
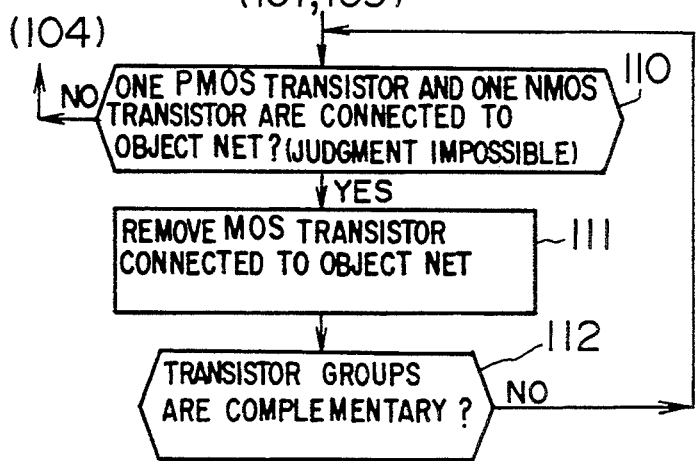

If the connection between PMOS and NMOS transistors is not complementary, there is a possibility that the group includes two or more clocked gates having a common output net, or one or more clocked gates and one logic gate other than the clocked gate respectively having a common output net. In this case, a plurality of PMOS transistors or NMOS transistors forming a single signal flow path from the output net to the power source net via the source or drain terminal, are bundled together as a PMOS transistor group and an NMOS transistor group. Of these PMOS or NMOS transistor groups, the groups having the same MOS transistor is collectively bundled together to form a single PMOS or NMOS transistor group. A combination of PMOS and NMOS transistor groups is formed at step (103). Each combination of PMOS and NMOS groups is subjected to the clocked gate recognition processing having steps 120, 130 and 113 described below. In the clocked gate recognition processing, first it is determined at step (120) whether the object net is the output net or the power source net in accordance with the identified connection of the clocked gate. While removing transistors from the object net, it is checked at step (130) if the connection between PMOS and NMOS transistor groups is complementary or not. If the connection is complementary, the PMOS and NMOS transistor groups in concern are judged as a clocked gate. The power source net includes a ground net. The flow chart for the steps 120 and 130 are shown in FIGS. 4a and 4b.

At the step 120, the clocked gate design information 160 is referred at step (105). If the design scheme for all clocked gates is to dispose MOS transistors connected in series with the output net via the source or drain terminal (at step 106), the output net is used as the object net (at step 107). The output net is a net to which the source or drain terminal of a PMOS and an NMOS transistor is connected. If the design scheme is to dispose MOS transistors connected in series with the power source via the source or gate terminal (at step 108), the power source net is used as the object net (at step 109). If there is no design information corresponding to transistor groups in concern, the following procedure is not performed.

At the step 130, of MOS transistors whose source or drain is connected in series with the object net (at step 110), the PMOS and NMOS transistors connected to the object net are sequentially removed (at step 111), and it is checked (at step 112) whether the connection between the left transistor groups is complementary or not. If the connection is complementary, the clocked gate judgment processing is carried out (at step 113). At the clocked gate judgment processing, the MOS transistors constituting the transistor groups in concern are judged as a clocked gate, and the gate terminal nets of the removed MOS transistors are judged at a clock signal. In addition, the function name is given and this clocked gate is considered as a single group. If the connection does not become complementary even if there are no MOS transistors connected in series to the object net via the source or drain terminal, the function cannot be discriminated so that the control returns to step 104 to process another combination of transistor groups.

Figure 4C:
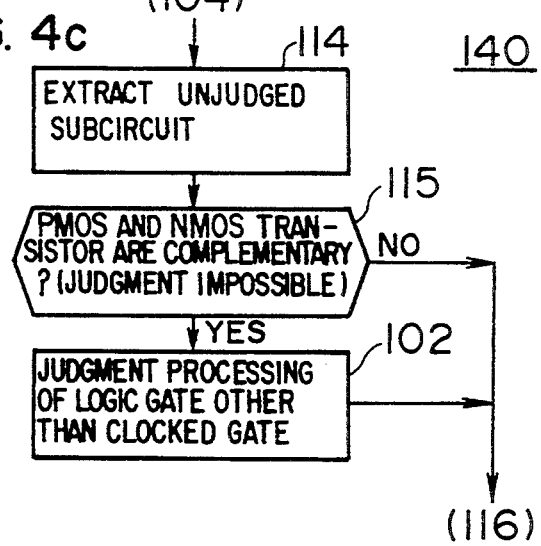

After the clocked gate recognition processing is completed for all combinations of transistor groups, the function of a logic gate in a circuit portion not judged is judged (at step 140). The detail of the step 140 is shown in FIG. 4c. A circuit portion still not judged as a clocked gate is extracted (at step 114). This corresponds to the case where the group inputted (at step 100) includes one or more clocked gate and one logic gate other than the clocked gate respectively having a common output net. Since a clocked gate is judged at the clocked gate recognition processing, the circuit portion not judged is judged whether or not it is a logic gate other than the clocked gate. To this end, it is checked (at step 115) if the connection between PMOS and NMOS transistors included in a circuit portion not judged is complementary or not. If the connection is complementary, the judgment processing for judging a logic gate other than the clocked gate is performed (at step 102) for the circuit portion not judged. If the connection between PMOS and NMOS transistors is not complementary, a function cannot be identified. Thereafter, a function name of each group is outputted (at step 116). Even the function of a group cannot be identified, the step 116 is carried out to notify of such effect.

Figure 5:
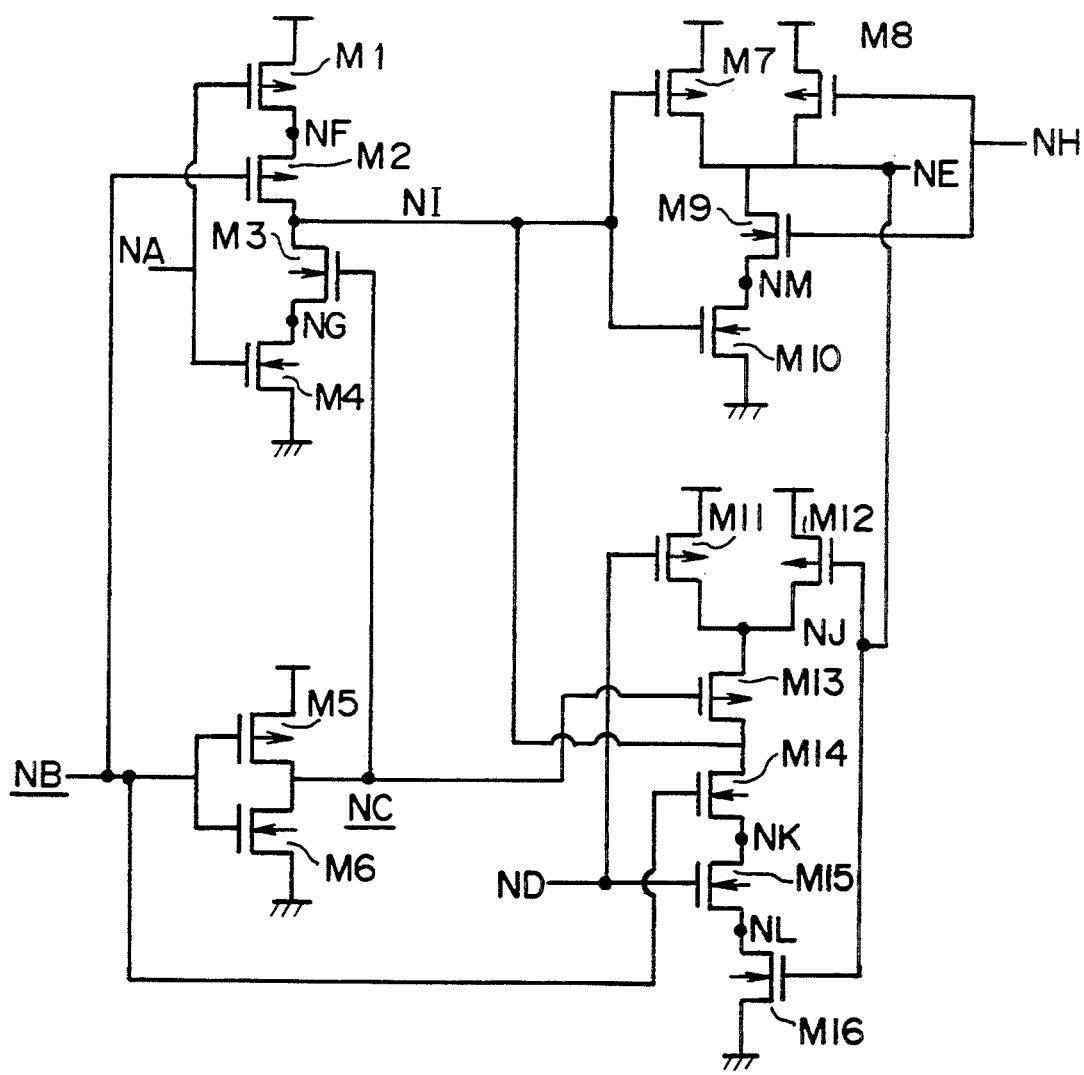
FIG. 5 is a circuit diagram of a transistor level CMOS logic circuit used for explaining the embodiment of this invention.
Figure 10A:
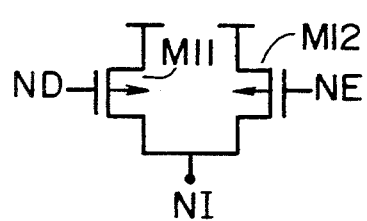
FIGS. 10A–10C show a combination of transistors shown in FIGS. 7b and 7c removing MOS transistors connected to the output net and shows the resultant MOS transistors.
Figure 10B:
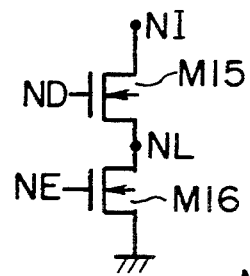
Figure 10C:
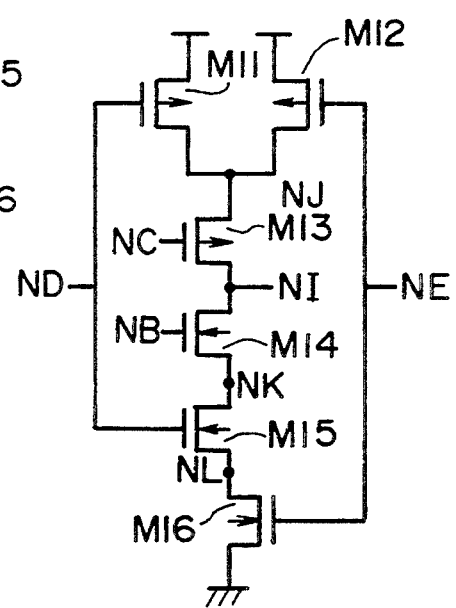
Figure 11:
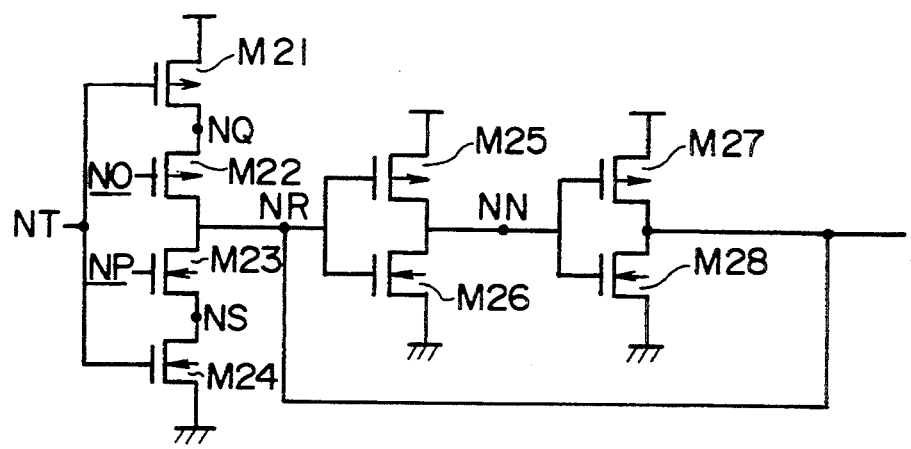
FIGS. 11 is a circuit diagram of a transistor level CMOS logic circuit used for explaining the embodiment of this invention.
Figure 14A:
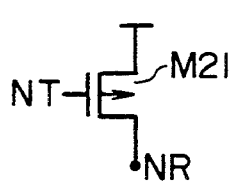
FIGS. 14A–14C show a combination of transistors shown in FIGS. 13a and 13c removing MOS transistors connected to the output net.
Figure 14B:
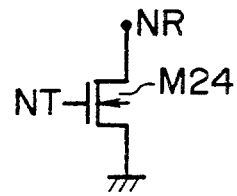
Figure 14C:
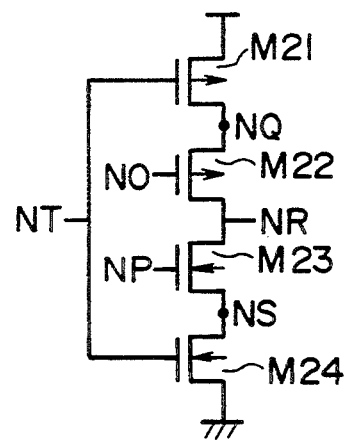
Figure 15:
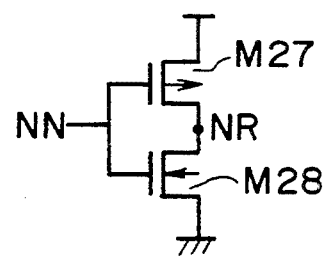
FIG. 15 is a circuit diagram of the group shown in FIG. 12b removing the circuit portion constituting the clocked gate.
Figure 16:
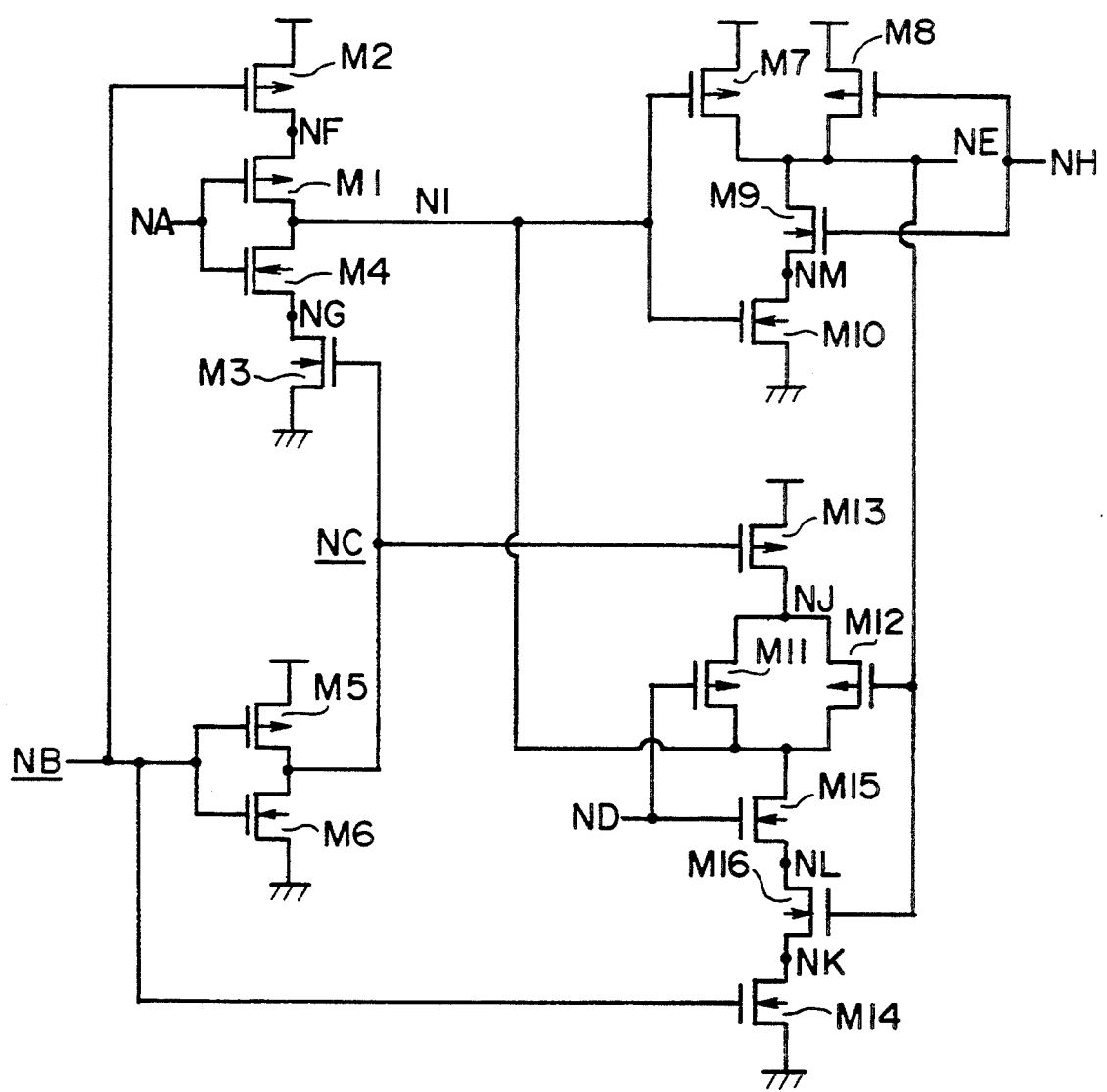
FIG. 16 is a circuit diagram of a transistor level CMOS logic circuit used for explaining the embodiment of this invention.
Figure 20A:
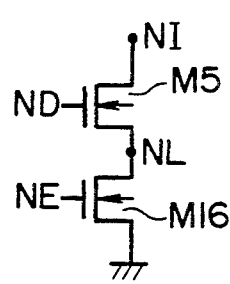
FIGS. 20A–20C show a combination of transistors shown in FIGS. 18b and 18c removing MOS transistors connected to the power source net, and shows the resultant MOS transistors.
Figure 20B:
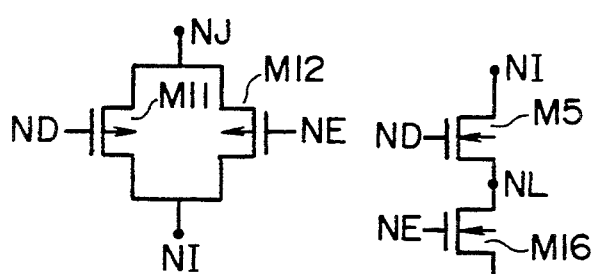
Figure 20C:
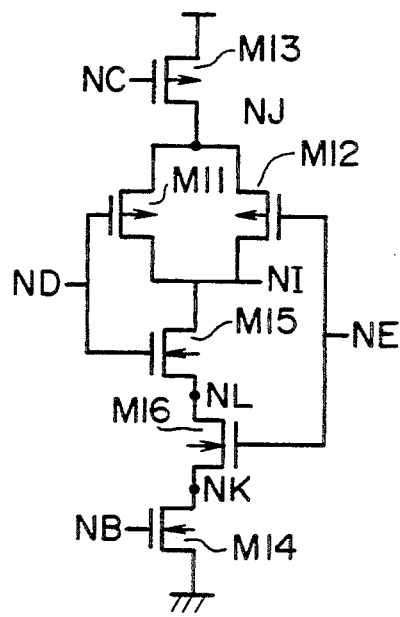
Figure 21:
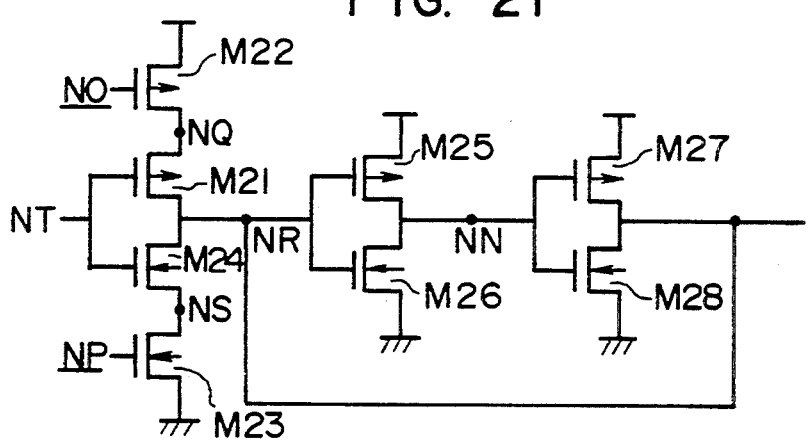
FIG. 21 is a circuit diagram of a transistor level CMOS logic circuit used for explaining the embodiment of this invention.

The present invention will be described with reference to CMOS logic circuits shown in FIGS. 5, 11, 16 and 21. In FIGS. 5, 11, 16 and 21, the underlined nets are those nets which are judged as a clock signal in the following description. The clocked gates in the circuits shown in FIGS. 5 and 11 are designed such that MOS transistors to which a clock signal is supplied at the gate terminal net, are connected in series with the clocked gate signal output net via the source or drain terminal. The clocked gates in the circuits shown in FIGS. 16 and 21 are designed such that MOS transistors to which a clock signal is supplied at the gate terminal net, are connected in series with the power source net via the source or drain terminal. FIGS. 5 and 16 are circuit diagrams used for explaining the method whereby if MOS transistor groups include two or more clocked gates having a common output net, elements constituting each logic gate are bundled together as a single group. FIGS. 6, 7, 8, 9 and 10 are used for explaining the circuit diagram shown in FIG. 5. FIGS. 17, 18, 19 and 20 are used for explaining the circuit diagram shown in FIG. 16. FIGS. 11 and 21 are circuit diagrams used for explaining the method whereby if MOS transistor groups include one or more clocked gate and one logic gate other than the clocked gate respectively having a common output net, elements constituting each logic gate are bundled together as a single group. FIGS. 12, 13, 14 and 15 are used for explaining the circuit diagram shown in FIG. 11. FIGS. 22, 23, 24 and 25 are used for explaining the circuit diagram shown in FIG. 21.

Referring to the CMOS logic circuit shown in FIG. 5, there will be described an embodiment of the method of dividing a circuit having two or more clocked gates having a common output net into circuit element groups each constituting a logic gate.

First, transistors are divided into groups by using connection information of the CMOS logic circuit elements shown in FIG. 5 (2401). Output nets connected to the source or drain terminals of PMOS and NMOS transistors are NC, NE and NI.

Figure 6A:
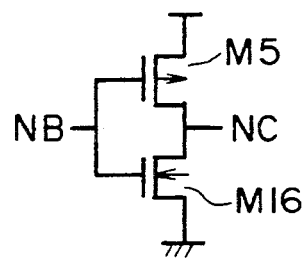
FIGS. 6A–6C illustrate groups of the CMOS logic circuit shown in FIG. 5.

MOS transistors connected to a path from the net NC to the power source net via the source or drain terminal are M5 and M6 which are represented as a group 1. Group 1 is shown in FIG. 6a.

Figure 6B:
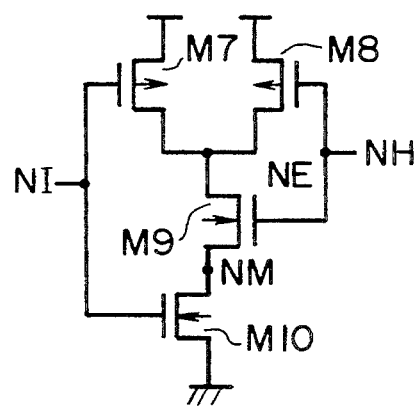

MOS transistors connected to a path from the net NE to the power source net via the source or drain terminal are M7, M8, M9 and M10 which are represented as a group 2. Group 2 is shown in FIG. 6b.

Figure 6C:
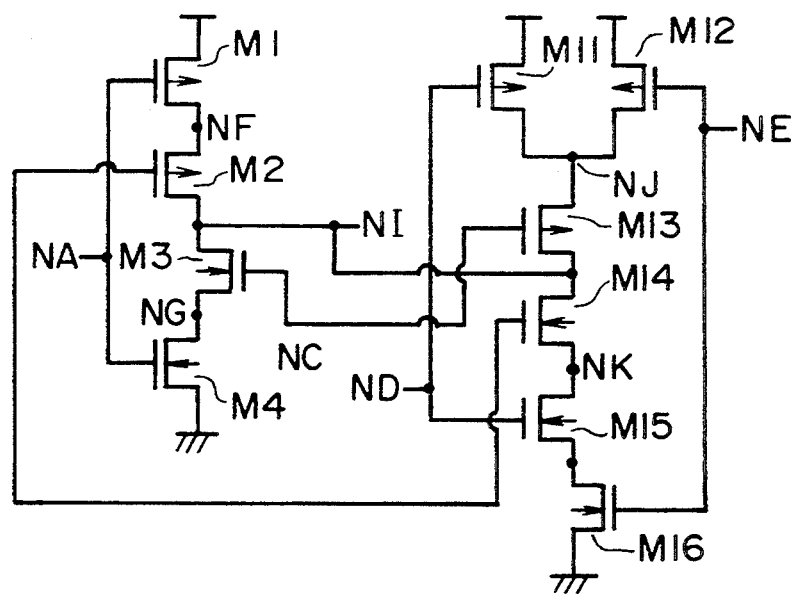

MOS transistors connected to a path from the net NI to the power source net via the source or drain terminal are M1, M2, M3, M4, M11, M12, M13, M14, M15 and M16 which are represented as a group 3. Group 3 is shown in FIG. 6c.

Next, each group undergoes subdivision (2402) and function recognition (2403) processing.

The subdivision and function recognition of group 1 will be described in the following.

First, the connection of PMOS and NMOS transistors of group 1 is checked (101). There are one PMOS transistor M5 having net NB as its gate terminal net and one NMOS transistor M6 having the same net NB as its gate terminal net. Since the gate terminal nets (NB) of transistors M5 and M6 are coincident, the connection between the PMOS and NMOS transistors is complementary. Group 1 constructed of one PMOS transistor and one NMOS transistor is given a function name of inverter (102) to terminate the processing for group 1.

The subdivision and function recognition of group 2 will be described in the following.

First, the connection of PMOS and NMOS transistors of group 2 is checked (101). There are a PMOS transistor M7 having net NI as its gate terminal net and a PMOS transistor M8 having net NH as its gate terminal net, and these PMOS transistors are parallel. NMOS transistors having net NI or NH are M10 and M9 are serial. In other words, PMOS transistors and NMOS transistors are complementary. Group 2 constructed of two parallel PMOS transistors and two serial NMOS transistors is given a function name of two-input NAND (102) to terminate the processing for group 2. The data to be outputted indicates that M7, M8, M9 and M10 constitute a two-input NAND.

The subdivision and function recognition processing for group 3 will be described in the following.

First, the connection between PMOS and NMOS transistors of group 3 is checked (101). A PMOS transistor M1 having net NA as its gate terminal net and a PMOS transistor M2 having net NB as its gate terminal net are serial. A PMOS transistor M11 having net NI as its gate terminal net and a PMOS TRANSISTOR M12 having net NE as its gate terminal net are parallel. A set of M11 and M12 and a PMOS transistor M13 having net NC as its gate terminal net are serial. A set of M1 and M2 and a set of M11, M12 and M13 are parallel. An NMOS transistor M3 having net NC as its gate terminal net and an NMOS transistor M4 having net NA as its gate terminal net are serial. An NMOS transistor M14 having net NB as its gate terminal net, an NMOS transistor M15 having net ND as its gate terminal net, and an NMOS transistor M16 having net NE as its gate terminal net, are serial. A set of M3 and M4 and a set of M14, M15 and M16 are parallel. In group 3, PMOS transistor M11 having net ND as its gate terminal net and PMOS transistor M12 having net NE as its gate terminal net are parallel, and NMOS transistor M15 having net ND as its gate terminal and NMOS transistor M16 having net NE as its gate terminal are serial. These connections are complementary, but the other connections are not complementary. Therefore, there is a possibility that a plurality of logic gates having a common output net are included in group 3 shown in FIG. 6c. The clocked gate recognition processing described below is therefore executed.

First, PMOS transistor groups and NMOS transistor groups are formed which are connected to a path from the output net NI to the power source net via the source or drain terminal (103). MOS transistors connected to the output net NI are M2, M13, M14 and M3 from which transistor groups reaching to the power source net are formed.

Figure 7A:
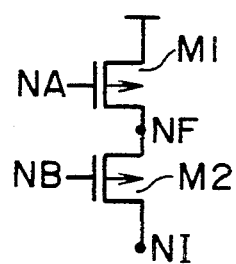
FIGS. 7A–7D show transistors constituting the group shown in FIG. 6c.

The source and drain terminals of M2 are NF and NI, respectively, the net NF being connected to M1. The source and drain of M1 are the power source net and NF, respectively. M1 and M2 between the output net NI and the power source net therefore constitute one PMOS transistor group. This transistor group is shown in FIG. 7a.

Figure 7B:
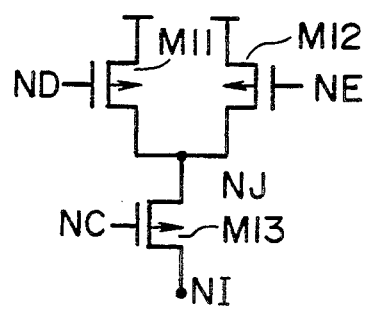

The source and drain terminals of M13 are NJ and NI, respectively, NJ being connected to M11 and M12, and the source and drain terminals of M11 as well as M12 are the power source net and NJ, respectively. M11, M12 and M13 between the output net NI and the power source net therefore constitute a PMOS transistor group. This transistor group is shown in FIG. 7b.

The source and drain terminals of M14 are NK and NI, respectively, NK being connected to M15, the source and drain terminals of M15 are NL and NK, respectively, NL being connected to M16, and the source and drain terminals of M16 are the power source net and NL, respectively. M14, M15 and M16 between the output net NI and power source net therefore constitute an NMOS transistor group. This transistor group is shown in FIG. 7c.

The source and drain terminals of M3 are NG and NI, respectively, NG being connected to M4, and the source and drain terminals of M4 are the power source net and NG, respectively. M3 and M4 between the output net NI and the power source net therefore constitute an NMOS transistor group. This transistor group is shown in FIG. 7d.

Clocked gates are recognized by forming a combination of PMOS and NMOS transistor groups. PMOS transistor groups are those shown in FIGS. 7a and 7b, and NMOS transistor groups are those shown in FIGS. 7c and 7d. Therefore, there are provided a combination of FIGS. 7a and 7c, a combination of FIGS. 7a and 7d, a combination of FIGS. 7b and 7c, and a combination of FIGS. 7b and 7d.

Figure 7C:
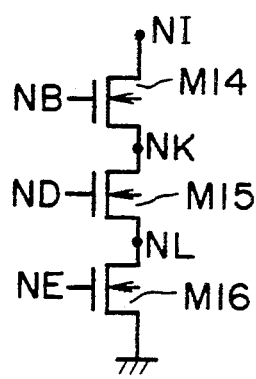
Figure 7D:
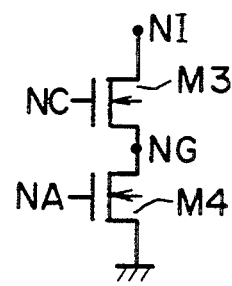

For the combination of FIGS. 7a and 7c, it can be seen upon reference (105) to the clocked gate design information 160 that MOS transistors to which a clock signal is supplied are disposed with their source or drain terminals connected in series with the output net. Using as the object net the output net, MOS transistors whose source or drain terminal is connected in series with the object net are sequentially removed from the combination of PMOS and NMOS transistor groups (110, 111). At this time, it is confirmed whether or not the connection is complementary (112). It can be recognized therefore that the combination of PMOS and NMOS transistor groups before removal is a clocked gate and that the removed transistors are MOS transistors to which a clock signal is inputted.

Figure 8A:
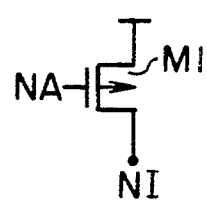
FIGS. 8A and 8B show a combination of transistors shown in FIGS. 7a and 7c removing MOS transistors connected to the output net.
Figure 8B:
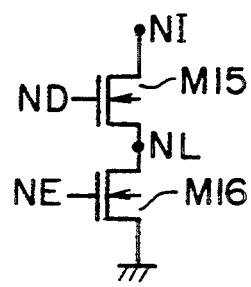

In FIGS. 7a and 7c, first PMOS transistor M2 and NMOS transistor M14 connected to the object net NI are removed by shorting them so that net NF becomes equivalent to net NI, and net NK becomes equivalent to net NI. Accordingly, net NF is replaced with net NI, and net NK is replaced with net NI. As a result, the PMOS transistor group becomes as constructed of M1 having net NA as its gate terminal net as shown in FIG. 8a, whereas the NMOS transistor group becomes as constructed of M15 having net ND as its gate terminal net and M16 having net NE as its gate terminal net as shown in FIG. 8b. The connection between the PMOS and NMOS transistor groups is not complementary. After the PMOS transistor M1 and NMOS transistor M15 connected in series with the object net NI are removed, the PMOS transistor group becomes absent so that the clocked gate recognition for this combination is terminated.

Figure 9A:
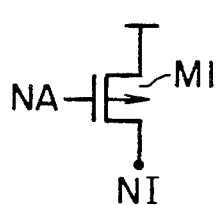
FIGS. 9A–9C show a combination of transistors shown in FIGS. 7a and 7d removing MOS transistors connected to the output net, and shows the resultant MOS transistors.
Figure 9B:
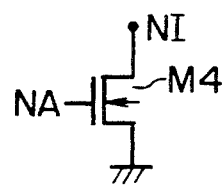
Figure 9C:
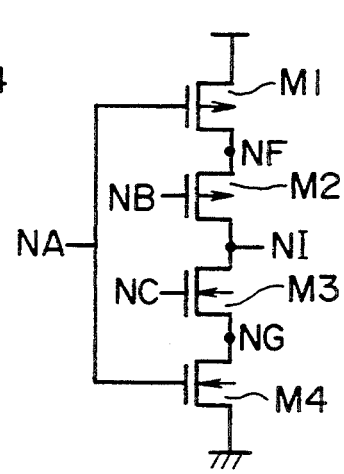

For the combination of FIGS. 7a and 7d, similar to the above-described combination, the clocked gate recognition is executed by using the output net as the object net. First, PMOS transistor M2 and NMOS transistor M3 connected to the object net NI are removed by shorting them so that net NF becomes equivalent to net NI and net NG becomes equivalent to net NI. Accordingly, net NF is replaced with net NI, and net NG is replaced with net NI. As a result, the PMOS transistor group becomes as constructed of M1 having net NA as its gate terminal net as shown in FIG. 9a, whereas the NMOS transistor group becomes as constructed of M4 having net NA as its gate terminal net as shown in FIG. 9b. The PMOS and NMOS transistor groups are each constructed of one MOS transistor. Since the gate terminal nets thereof are the same (NA), the connection between the PMOS and NMOS transistor groups is complementary and the function name is an inverter. Accordingly the combination of the PMOS transistor group shown in FIG. 7a and the NMOS transistor group shown in FIG. 7d is judged as a clocked inverter. The circuit diagram of this combination is shown in FIG. 9c. Nets NB and NC as the gate terminal nets of the removed MOS transistors M2 and M3 are judged as the nets for clock signal (113).

Also for the combination of FIGS. 7b and 7c, similar to the above-described combinations, the clocked gate recognition is executed by using as the object net the output net. First, PMOS transistor M13 and NMOS transistor M14 connected to the object net NI are removed by shorting them so that net NJ becomes equivalent to net NI and net NK becomes equivalent to net NI. Accordingly, net NJ is replaced with net NI, and net NK is replaced with net NI. As a result, the PMOS transistor group becomes as constructed of a parallel circuit of M11 having net ND as its gate terminal net and M12 having net NE as its gate terminal net as shown in FIG. 10a. NMOS transistors having net NE or ND as their gate terminal net are M15 and M16 which are shown in FIG. 10b. The PMOS and NMOS transistors are each constructed of two MOS transistors, and are complementary. Accordingly, the combination of the PMOS transistor group shown in FIG. 7b and the NMOS transistor group shown in FIG. 7c is judged as constituting a clocked two-input NAND. The circuit diagram of this combination is shown in FIG. 10(c). Nets NC and NB as the gate terminal nets of the removed MOS transistors M13 and M14 are judged as the nets for clock signal (113).

For the combination of FIGS. 7b and 7d, the transistor groups are combined to the other transistor groups (FIGS. 7c and 7a) to constitute clocked gates so that the clocked gate recognition processing is not executed.

The clocked gate recognition processing for the combinations of PMOS and NMOS transistor groups has thus been executed. Since there is no circuit portion which has not been judged as the clocked gate, there is no circuit which is to be obtained upon execution of extracting (114) a circuit portion not judged as yet. Namely, there is not executed a judgment (115) for judging whether or not the connection between PMOS and NMOS transistors of a circuit portion not judged is complementary. The processing for group 3 is thus completed. The output data indicates that M1, M2, M3 and M4 constitute a clocked inverter, and M11, M12, M13, M14, M15 and M16 constitute a clocked two-input NAND.

Referring to the CMOS logic circuit shown in FIG. 11, there will be described an embodiment of the method of dividing a circuit having one or more clocked gates having a common output net and one logic gate other than the clocked gate into circuit element groups each constituting a logic gate.

First, transistors are divided into groups by using connection information of the CMOS logic circuit elements shown in FIG. 11 (2401). Output nets connected to the source or drain terminals of PMOS and NMOS transistors are NN and NR.

Figure 12A:
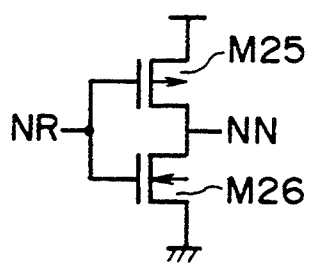
FIGS. 12A and 12B illustrate groups of the CMOS logic circuit shown in FIG. 11.

MOS transistors connected to a path from the net NN to the power source net via the source or drain terminal are M25 and M26 which are represented as a group 1. Group 1 is shown in FIG. 12a.

Figure 12B:
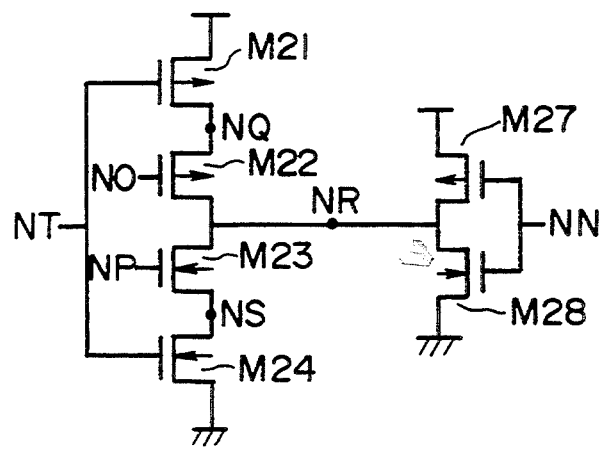

MOS transistors connected to a path from the net NR to the power source net via the source or drain terminal are M21, M22, M23, M24, M27 and M28 which are represented as a group 2. Group 2 is shown in FIG. 12b.

Next, each group undergoes subdivision (2402) and function recognition (2403) processing.

The subdivision and function recognition of group 1 will be described in the following.

First, the connection of PMOS and NMOS transistors of group 1 is checked (101). There are one PMOS transistor M25 having net NR as its gate terminal net and one NMOS transistor M26 having the same net NR as its gate terminal net. Since the gate terminal nets (NR) of transistors M25 and M26 are coincident, the connection between the PMOS and NMOS transistors is complementary. Group 1 constructed of one PMOS transistor and one NMOS transistor is given a function name of inverter (102) to terminate the processing for group 1. The output data indicates that M25 and M26 constitute an inverter.

The subdivision and function recognition of group 2 will be described in the following.

First, the connection of PMOS and NMOS transistors of group 2 is checked (101). There are a PMOS transistor M21 having net NT as its gate terminal net and a PMOS transistor M22 having net NO as its gate terminal net, and these PMOS transistors are serial. A set of M21 and M22 and a PMOS transistor M27 having net NN as its gate terminal net are parallel. An NMOS transistor M23 having net NP as its gate terminal and an NMOS transistor having net NT as its gate terminal net are serial. A set of M23 and M24 and an NMOS transistor M28 having net NN as its gate terminal are parallel. These connections are not complementary. Therefore, there is a possibility that a plurality of logic gates having a common output net are included in group 2. The clocked gate recognition processing described below is therefore executed.

First, PMOS transistor groups and NMOS transistor groups are formed which are connected to a path from the output net NR to the power source net via the source or drain terminal (103). MOS transistors connected to the output net NR are M22, M27, M23 and M28.

Figure 13A:
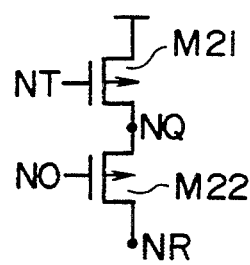
FIGS. 13A and 13D show transistors constituting the group shown in FIG. 12b.

The source and drain terminals of M22 are NQ and NR, respectively, NQ being connected to M21, and the source and drain of M21 are the power source net and NQ, respectively. M21 and M22 between the output net and the power source net therefore constitute one PMOS transistor group. This transistor group is shown in FIG. 13a.

Figure 13B:
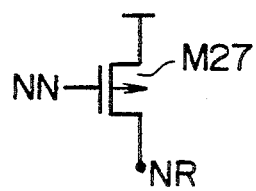

The source and drain terminals of M27 are the power source net and NR, respectively, so that M27 constitutes a PMOS transistor group. This transistor group is shown in FIG. 13b.

The source and drain terminals of M23 are NS and NR, respectively, NS being connected to M24, and the source and drain terminals of M24 are the power source net and NS. M23 and M24 between the output net and power source net therefore constitute an NMOS transistor group. This transistor group is shown in FIG. 13c.

The source and drain terminals of M28 are the power source net and NR, respectively, so that M28 constitutes an NMOS transistor. This transistor group is shown in FIG. 13d.

A combination of PMOS and NMOS transistor groups is then formed (103). PMOS transistor groups are those shown in FIGS. 13a and 13b, and NMOS transistor groups are those shown in FIGS. 13c and 13d. Therefore, there are provided a combination of FIG. 13a and 13c, a combination of FIGS. 13a and 13d, a combination of FIGS. 13b and 13c, and a combination of FIGS. 13b and 13d.

Figure 13C:
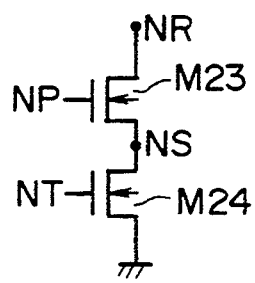
Figure 13D:
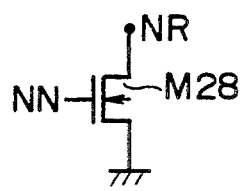

For the combination of FIGS. 13a and 13c, it can be seen upon reference (105) to the clocked gate design information 160 that MOS transistors to which a clock signal is supplied are disposed with their source or drain terminals connected in series with the output net. Using as the object net the output net, MOS transistors whose source or drain terminal is connected in series with the object net are sequentially removed from the combination of PMOS and NMOS transistor groups (110, 111). At this time, the clocked gate recognition is executed by confirming whether or not the connection is complementary (112).

First, PMOS transistor M22 and NMOS transistor M23 connected to the object net NR are removed by shorting them so that net NQ becomes equivalent to net NR, and net NS becomes equivalent to net NR. Accordingly, net NQ is replaced with net NR, and net NS is replaced with net NR. As a result, the PMOS transistor group becomes as constructed of M21 having net NT as its gate terminal net as shown in FIG. 14a, whereas the NMOS transistor group becomes as constructed of M24 having net NT as its gate terminal net as shown in FIG. 14b. The PMOS and NMOS transistor groups are each constructed of one MOS transistor. Since the gate terminal nets thereof are the same (NT), the connection between the PMOS and NMOS transistor groups is complementary and the function name is an inverter. Accordingly, the combination of the PMOS transistor group shown in FIG. 13a and the NMOS transistor group shown in FIG. 13c are judged as constituting a clocked inverter. The circuit diagram of this combination is shown in FIG. 9c. Nets NO and NP as the gate terminal nets of the removed MOS transistors M22 and M23 are judged as the nets for clock signal (113).

For the combination of FIGS. 13a and 13d, the transistor group shown in FIG. 13a is combined to the other transistor group shown in FIG. 13c to constitute the clocked gate so that the clocked gate recognition processing is not executed.

Similarly, for the combination of FIGS. 13b and 13c, the transistor group shown in FIG. 13c is combined to the other transistor group shown in FIG. 13a to constitute the clocked gate so that the clocked gate recognition processing is not executed.

For the combination of FIGS. 13b and 13d, similar to the above-described combinations, the clocked gate recognition is executed by using the output net as the object net. First, PMOS transistor M27 and NMOS transistor M28 connected to the object net NR are removed by shorting them. Both the transistor groups become absent so that it is not possible to judge that they constitute a clocked gate. The clocked gate recognition processing for this combination is therefore terminated.

The clocked gate recognition processing for the combinations of PMOS and NMOS transistor groups has thus been executed. Upon extracting a circuit portion not judged as a clock gate (114), there is obtained a circuit constructed of the PMOS transistor M27 and NMOS transistor M28 as shown in FIG. 15. Since the gate terminal nets thereof are the same (NN), the connection between the PMOS and NMOS transistors is complementary (115). The circuit shown in FIG. 15 can therefore be judged as constituting an inverter constructed of a combination of such transistor groups (102). The processing for group 2 is thus completed (116). The output data indicates that M21, M22, M23 and M24 constitute a clocked inverter, and M27 and M28 constitute an inverter.

Referring to the CMOS logic circuit shown in FIG. 16, there will be described an embodiment of the method of dividing a circuit having two or more clocked gates having a common output net into circuit element groups each constituting a logic gate.

First, transistors are divided into groups by using connection information of the CMOS logic circuit elements shown in FIG. 16 (2401). Output nets connected to the source or drain terminals of PMOS and NMOS transistors are NC, NE and NI.

Figure 17A:
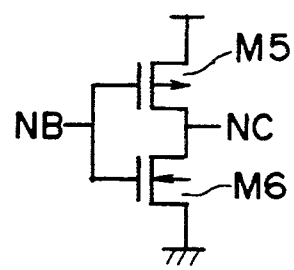
FIGS. 17A–17C illustrates groups of the CMOS logic circuit shown in FIG. 16.
Figure 17B:
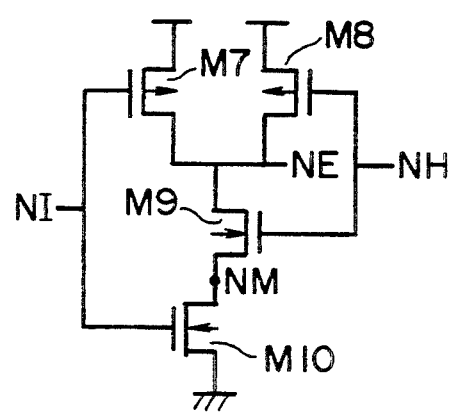
Figure 17C:
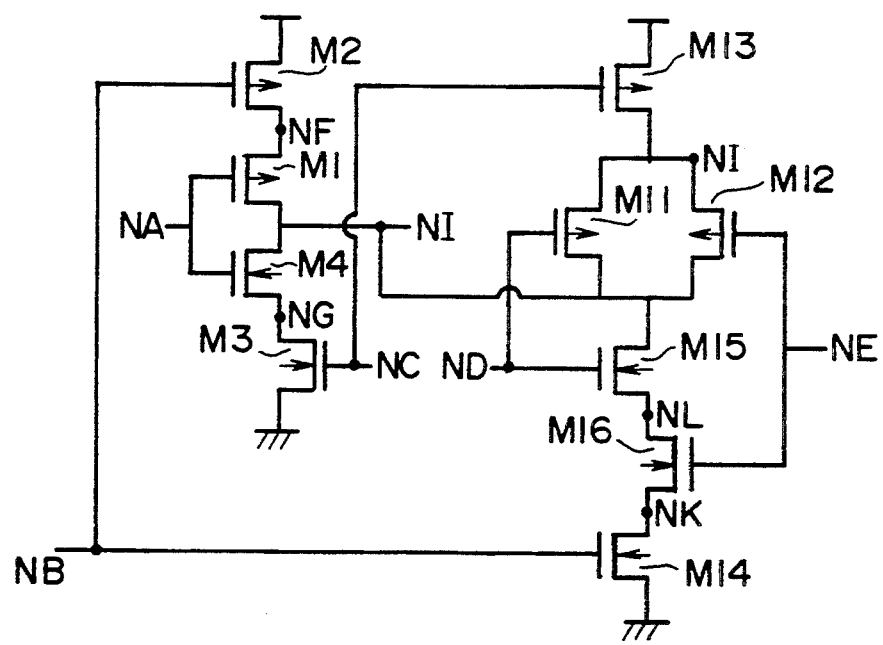

The circuit shown in FIG. 16 is divided into groups in the same grouping method used with the embodiment shown in FIG. 5, so that there are formed group 1 shown in FIG. 17a, group 2 shown in FIG. 17b, and group shown in FIG. 17c.

Next, each group undergoes subdivision (2402) and function recognition (2403) processing.

The circuit arrangement of group 1 shown in FIG. 17a is the same as group 1 shown in FIG. 6a. Accordingly the output data indicates that M5 and M6 constitute an inverter.

The circuit arrangement of group 2 shown in FIG. 17b is the same as group 2 shown in FIG. 6b. Accordingly, the output data indicates that M7, M8, M9 and M10 constitute a two-input NAND.

The subdivision and function recognition processing for group 3 will be described in the following.

First, the connection between PMOS and NMOS transistors of group 3 is checked (101). Similar to group 3 shown in FIG. 6c, this check results show that the connection is not complementary. Therefore, there is a possibility that a plurality of logic gates having a common output net are included in group 3. The clocked gate recognition processing described below is therefore executed.

First, PMOS transistor groups and NMOS transistor groups are formed which are connected to a path from the output net NI to the power source net via the source or drain terminal (103). Subdividing group 3 in the similar manner as of group 3 shown in FIG. 6c results in a PMOS transistor group constructed of M1 and M2 as shown in FIG. 18a, a PMOS transistor group constructed of M11, M12 and M13 as shown in FIG. 18b, an NMOS transistor group constructed of M14, M15 and M16 as shown in FIG. 18c, and an NMOS transistor group constructed of M3 and M4 as shown in FIG. 18d.

Figure 18A:
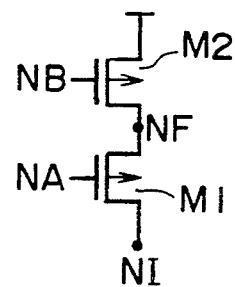
FIGS. 18A–18D show transistors constituting the group shown in FIG. 17c.
Figure 18B:
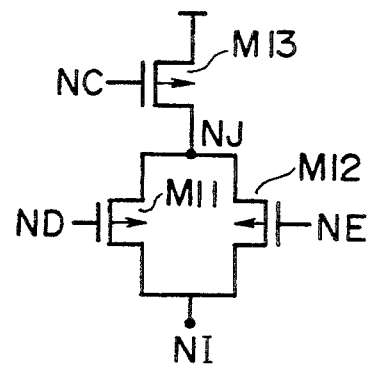
Figure 18C:
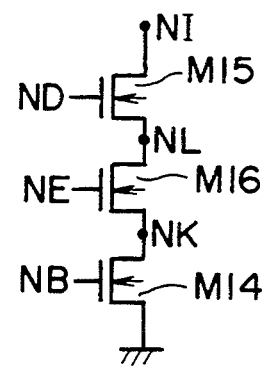
Figure 18D:
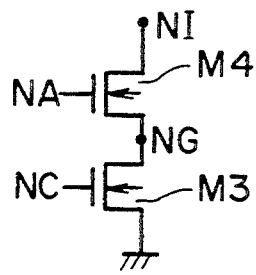

Clocked gates are recognized by forming a combination of PMOS and NMOS transistor groups, PMOS transistor groups are those shown in FIGS. 18a and 18b, and NMOS transistor groups are those shown in FIGS. 18c and 18d. Therefore, there are provided a combination of FIGS. 18a and 18c, a combination of FIGS. 18a and 18d, a combination of FIGS. 18b and 18c, and a combination of FIGS. 18b and 18d.

The combination of FIGS. 18a and 18c will be described. Upon reference (105) to the clocked gate design information 160, it can be seen that there is applied a method where the source or drain terminals are disposed in series with the power source net. Therefore, by using the power source net as the object net, the clocked gate recognition is executed. Similar to the combination of FIGS. 7a and 7c, when if MOS transistors connected to the object net are sequentially removed, it is judged that the connection between PMOS and NMOS transistors is not complementary. The clocked gate recognition processing for this combination is therefore terminated.

Figure 19A:
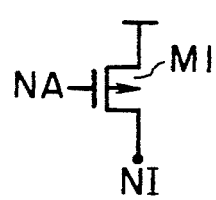
FIGS. 19A–19C show a combination of transistors shown in FIGS. 18a and 18d removing MOS transistors connected to the power source net, and shows the resultant MOS transistors.
Figure 19B:
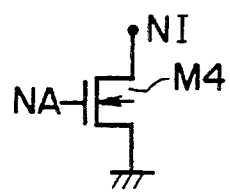
Figure 19C:
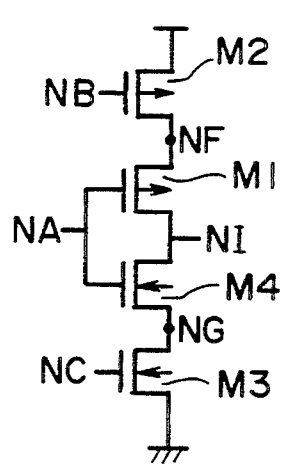

For the combination of FIGS. 18a and 18d, upon reference (105) to the clocked gate design information 160, it can be seen that there is applied the method where the source or drain terminals are disposed in series with the power source net. Therefore, by using the power source net as the object net, the clocked gate recognition is executed. Similar to the combination of FIGS. 7a and 7d, PMOS transistor M2 and NMOS transistor M3 connected in series with the object net NI are removed so that the PMOS transistor group is constructed as shown in FIG. 19a and the NMOS transistor group is constructed as shown in FIG. 19b. Since the connection between PMOS and NMOS transistor groups is complementary, a function name of inverter is given thereto. Accordingly the combination of the PMOS transistor group shown in FIG. 18a and the NMOS transistor group shown in FIG. 18d are judged as constituting a clocked inverter. The circuit diagram of this combination is shown in FIG. 19c. Nets NB and NC as the gate terminal nets of the removed MOS transistors M2 and M3 are judged as the nets for clock signal (113).

For the combination of FIGS. 18b and 18c, similar to the above-described combination, the clocked gate recognition is executed by using the power source net as the object net. Similar to the combination of FIGS. 7b and 7c, PMOS transistor M13 and NMOS transistor M14 connected to the object net NI are removed by shorting them so that the PMOS transistor group is constructed as shown in FIG. 20a and the NMOS transistor group is constructed as shown in FIG. 29b. Since the connection between PMOS and NMOS transistor groups is complementary, a function name is a two-input NAND. Accordingly the combination of the PMOS transistor group shown in FIG. 18b and the NMOS transistor group shown in FIG. 18c are judged as constituting a clocked two-input NAND. The circuit diagram of this combination is shown in FIG. 20c. Nets NC and NB as the gate terminal nets of the removed MOS transistors M13 and M14 are judged as the nets for clock signal (113).

For the combination of FIGS. 18b and 18d, the transistor groups are combined to the other transistor groups (FIGS. 18c and 18a) to constitute clocked gates so that the clocked gate recognition processing is not executed.

The clocked gate recognition processing for the combinations of PMOS and NMOS transistor groups has thus been executed. Since there is no circuit portion which has not been judged as the clocked gate, there is no circuit which is to be obtained upon execution of extracting (114) a circuit portion not judged as yet. Namely, there is not executed a judgment (115) for judging whether or not the connection between PMOS and NMOS transistors of a circuit portion not judged is complementary. The processing for group 3 is thus completed. The output data indicates that M1, M2, M3 and M4 constitute a clocked inverter, and M11, M12, M13, M14, M15 and M16 constitute a clocked two-input NAND.

Referring to the CMOS logic circuit shown in FIG. 21, there will be described an embodiment of the method of dividing a circuit having one or more clocked gates having a common output net and one logic gate other than the clocked gate into circuit element groups each constituting a logic gate.

First, transistors are divided into groups by using connection information of the CMOS logic circuit elements shown in FIG. 21 (2401). Output nets connected to the source or drain terminals of PMOS and NMOS transistors are NN and NR. In the same grouping method using the connection information of the CMOS logic circuit elements shown in FIG. 11, the circuit shown in FIG. 21 is divided into group 1 shown in FIG. 22a and group 2 shown in FIG. 22b.

Next, each group undergoes subdivision (2402) and function recognition (2403) processing.

Figure 22A:
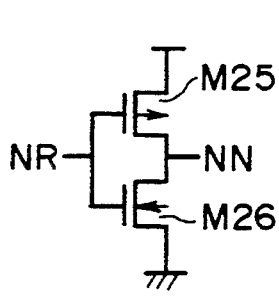
FIGS. 22A and 22B illustrate groups of the CMOS Logic circuit shown in FIG. 21.
Figure 22B:
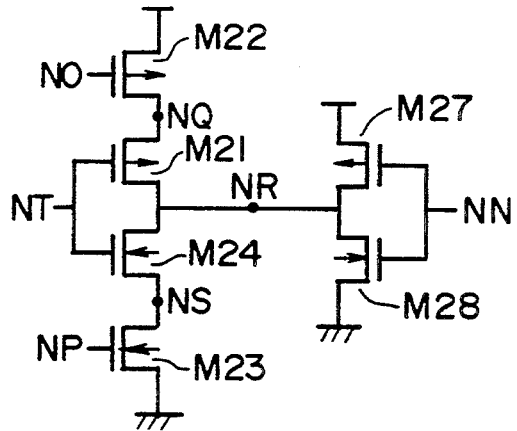

The circuit arrangement of group 1 shown in FIG. 22a is the same as group 1 shown in FIG. 12a. Accordingly the output data indicates that M25 and M26 constitute an inverter.

The subdivision and function recognition processing for group 2 will be described in the following. First, the connection between PMOS and NMOS transistors of group 2 is checked (101). Similar to group 2 shown in FIG. 12b, the check results show that the connection is not complementary. Therefore, there is a possibility that a plurality of logic gates having a common output net are included in group 3. The clocked gate recognition processing described below is therefore executed.

First, PMOS transistor groups and NMOS transistor groups are formed which are connected to a path from the output net NR to the power source net via the source or drain terminal (103). Subdividing group 2 in the similar manner as of group 2 shown in FIG. 12 results in a PMOS transistor group constructed of M21 and M22 as shown in FIG. 23a, a PMOS transistor group constructed of M27 as shown in FIG. 23b, an NMOS transistor group constructed of M23 and M24 as shown in FIG. 23c, and an NMOS transistor group constructed of M28 as shown in FIG. 23d.

Next, a combination of PMOS and NMOS transistor groups is formed (103). PMOS transistor groups are those shown in FIGS. 23a and 23b, and NMOS transistor groups are those shown in FIGS. 23c and 23d. Therefore, there are provided a combination of FIGS. 23a and 23c, a combination of FIGS. 23a and 23d, a combination of FIGS. 23b and 23c, and a combination of FIGS. 23b and 23d.

For the combination of FIGS. 23a and 23c, upon reference (105) for the clocked gate design information 160, it can be seen that there is applied a method where MOS transistors to which a clock signal is supplied are disposed by connecting their source or drain terminals in series with the power source net. Therefore, by using the power source net as the object net, MOS transistors whose source or drain terminal is connected in series with the object net are sequentially removed from the combination of PMOS and NMOS transistor groups (110, 111). At this time, by confirming whether or not the connection is complementary (112), the clocked gate recognition is executed. This processing is repeated until MOS transistors whose source or drain terminal is connected in series with the object net become absent, or until the connection is confirmed as complementary upon removal of MOS transistors. First, similar to the combination of FIGS. 13a and 13d, PMOS transistor M22 and NMOS transistor M23 connected to the object net NR are removed by shoring them so that the PMOS transistor group is constructed as shown in FIG. 24a and the NMOS transistor group is constituted as shown in FIG. 24b. Since the connection between PMOS and NMOS transistor groups is complementary, a function name is an inverter. Accordingly the combination of the PMOS transistor group shown in FIG. 23a and the NMOS transistor groups shown in FIG. 23c are judged as constituting a clocked inverter. Nets NO and NP as the gate terminal nets of the removed MOS transistors M22 and M23 are judged as the nets for clock signal (113).

For the combination of FIGS. 23a and 23d, the transistor group of FIG. 23a is combined to the other transistor group shown in FIG. 23c to constitute the clocked gate so that the clocked gate recognition processing is not executed.

For the combination of FIGS. 23b and 23c, the transistor group of FIG. 23c is combined to the other transistor group shown in FIG. 23a to constitute the clocked gate so that the clocked gate recognition processing is not executed.

For the combination of FIGS. 23b and 23c, similar to the above-described combination, the clocked gate recognition is executed by using the output net as the object net. Similar to the combination of FIGS. 13b and 13d, PMOS transistor M27 and NMOS transistor M28 connected to the object net NR are removed by shorting them. Then both the transistor groups become absent so that it is not possible to judge the clocked gate is constituted. The clocked gate recognition for group 2 is therefore terminated.

The clocked gate recognition processing for the combinations of PMOS and NMOS transistor groups has thus been executed. Extracting (114) the circuit portion not judged as constituting the clocked gate results in the circuit constructed of M27 and M28 shown in FIG. 25. This circuit is constructed of one PMOS transistor M27 having net NN as its data terminal net and one NMOS transistor M28 having net NN as its gate terminal. Since the gate terminal nets thereof are the same net NN, the connection between the PMOS and NMOS transistors is complementary (115). The circuit shown in FIG. 25 can therefore be judged as constituting an inverter constructed of a combination of such transistor groups (102). The processing for group 2 is thus completed (116). The output data indicates that M21, M22, M23 and M24 constitute a clocked inverter, and M27 and M28 constitute an inverter.

With the above methods, the transistor level circuit data can be transformed into the logic level circuit data.

The structure of the logic gate level circuit data 3a outputted from the conversion processing 9 is shown in FIGS. 52a and 52b. FIG. 52a shows a logic gate table 220 which stores the information regarding logic gates constituting a circuit, and FIG. 52b shows a net table 230 which stores the information regarding nets interconnecting logic gates.

The fields of the logic gate table 220 will be described. A logic gate number 221 is a serial number for identifying each logic gate. A logic gate type 222 represents the information for identifying the function of each logic gate. An element number 223 indicates the number of elements constituting each logic gate, including the number of parasitic elements. A pointer 224 indicates a storage location within an element table 200 at which stored is the information regarding the elements of a logic gate in concern. A terminal type 225 is an identifier for indicating the terminal type of the logic gate in concern. A pointer 226 indicates a storage location within the net table 230 at which stored is the information regarding a net connected to the terminal of a logic gate.

The fields of the net table 230 will be described. A net number 231 is a serial number for identifying each net. A pointer number 232 indicates the number of nodes constituting a net in concern. A pointer 233 indicates a storage location within the node table 210 at which stored is the information regarding the nodes constituting a net in concern.

The pointer 226 of the logic gate table 220 and the net table 230 define the connection between respective logic gates.

By using the pointers in the tables shown in FIGS. 51a and 51b and FIGS. 52a and 52b, the transistor level circuit data 3 shown in FIGS. 51a and 51b can be transformed into the logic gate level circuit data, and if necessary, the inverse transformation can be made.

The logic gate level circuit data 3a shown in FIG. 1 is constructed of the transistor level circuit data 3 storing the table data shown in FIGS. 51a and 51b and the table data shown in FIGS. 52a and 52b.

Figure 53:
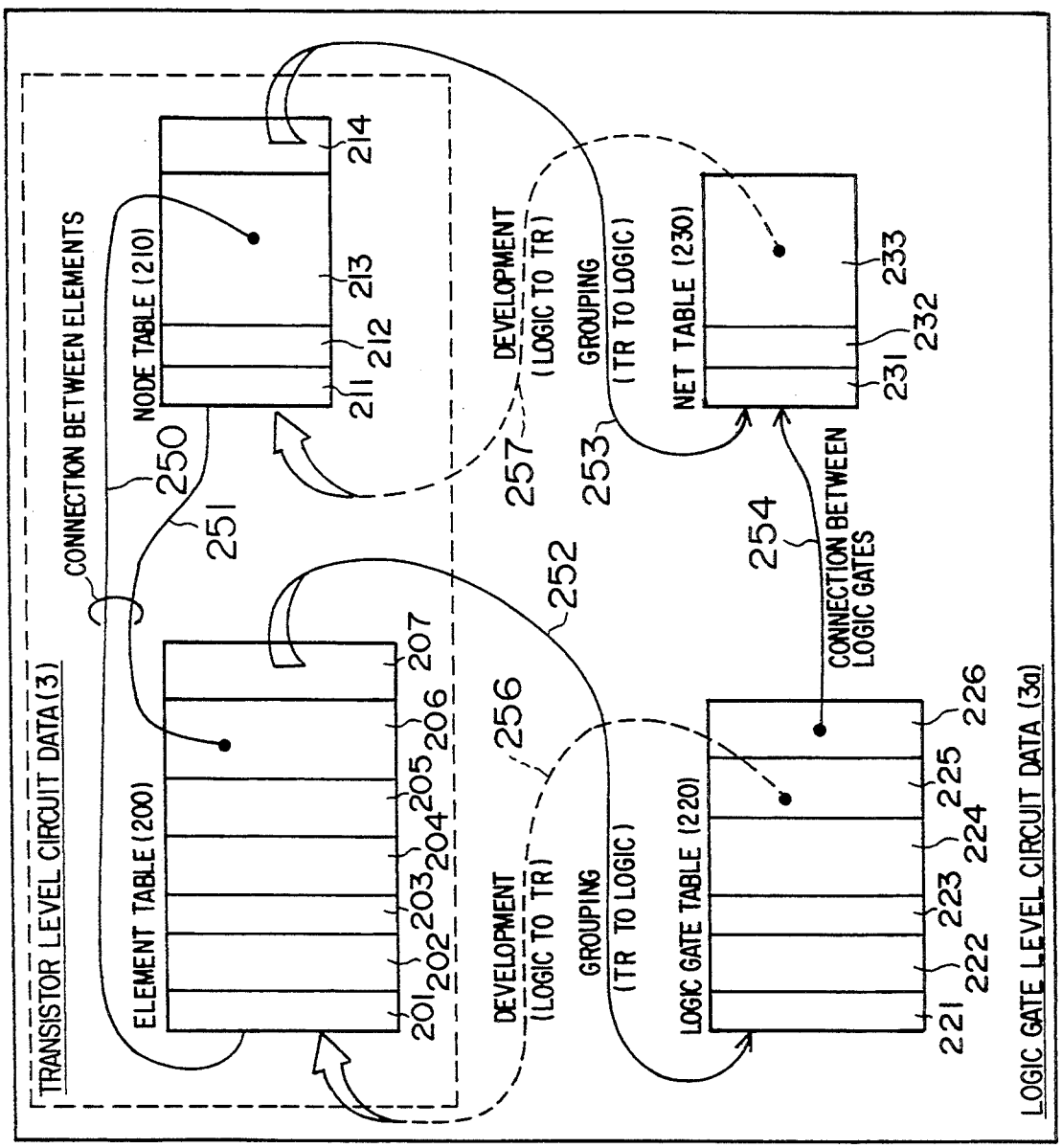
FIG. 53 is a diagram showing references between tables shown in FIGS. 51 and 52.

The correspondence between the tables (200, 210, 220 and 230) shown in FIGS. 51a and 51b and 52a and 52b is shown in FIG. 53. For the purpose of simplicity, the labels of the fields in each table are omitted in FIG. 53.

Arrows 250 and 251 between the element table 200 and node table 210 indicate the connection between elements. An arrow 252 indicates that a plurality of transistors are collected into one group to constitute one logic gate. On the contrary, an arrow with broken line 256 indicates that one logic gate is developed into a plurality of transistors. An arrow 253 indicates that a plurality of nodes are collected to form one net. On the contrary, an arrow with broken line 257 indicates that one net is developed into a plurality of nodes. By tracing the arrow 250, parasitic elements connected to the node can be detected. An arrow 254 indicates the connection between logic gates via a net.

Next, the circuit pickup processing 5 shown in FIG. 1 will be described. The circuit pickup processing includes a pickup processing 5a for picking up a circuit in accordance with a designation method to be described later, and an interface port processing 5b for adding an approximate load at the interface port of the picked-up subcircuit.

As the designation method used when a subcircuit is picked up from a circuit extracted from a layout pattern, three designations are possible including designation by a signal flow path unit, designation by a logic gate unit, and designation by a block unit.

Figure 26:
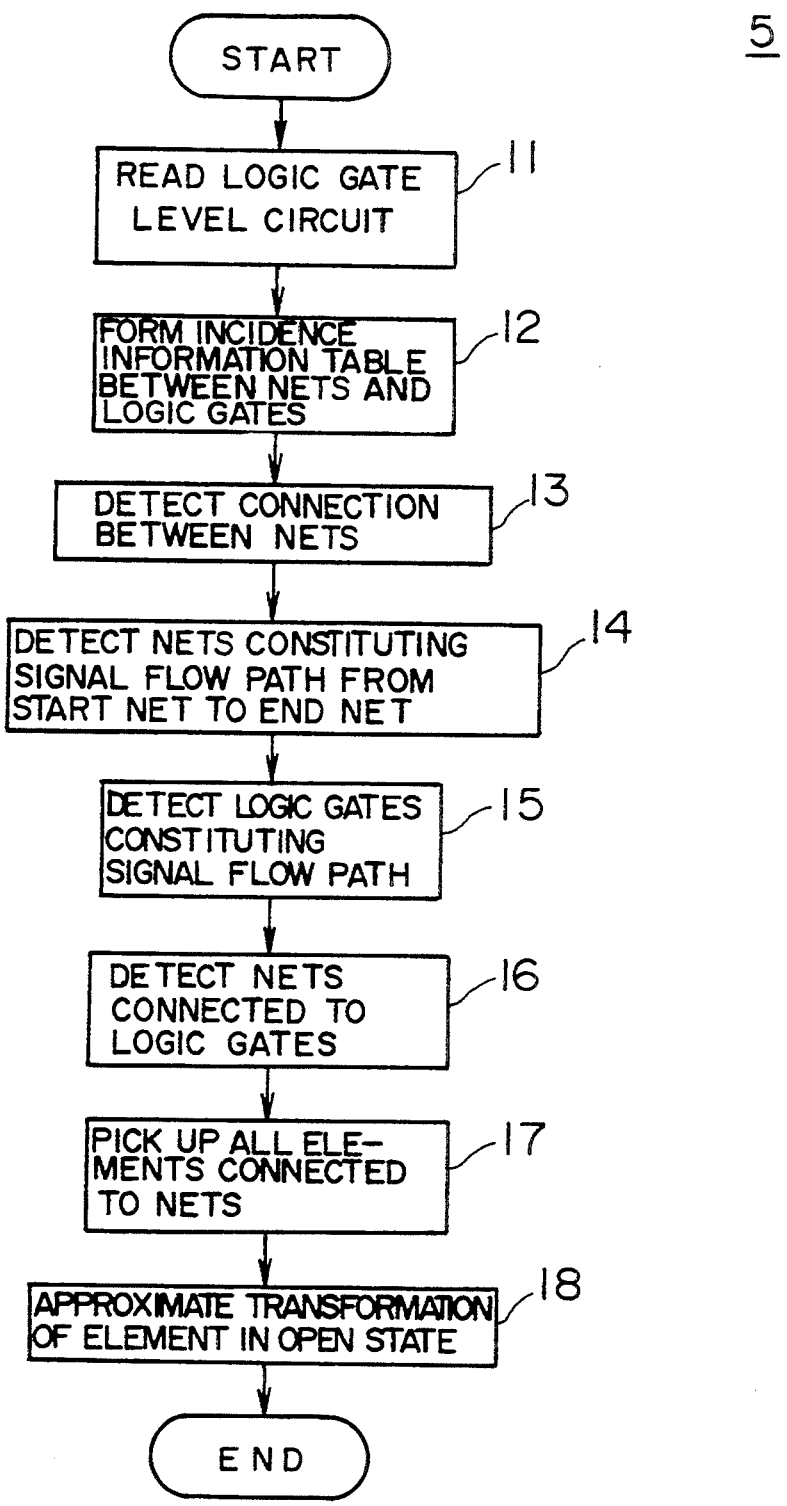
FIG. 26 is a flow chart illustrating picking up a subcircuit on the signal flow path basis.

The procedure for picking up a subcircuit on the signal flow path unit basis will be described with reference to FIG. 26. This method is constructed of the following steps. Various tables generated at the following steps are stored in a work file 170.

(1) Reading circuit data (step 11): reading the logic gate level circuit data 3a generated through extraction from the layout pattern 1.

(2) Generating an incidence information for nets and logic gates (step 12): generating an incidence information table for nets and logic gates in accordance with the circuit data 3a for all nets and logic gates.

(3) Detecting the connection between nets (step 13): detecting the connection and signal flow path direction between two nets.

Figure 27:
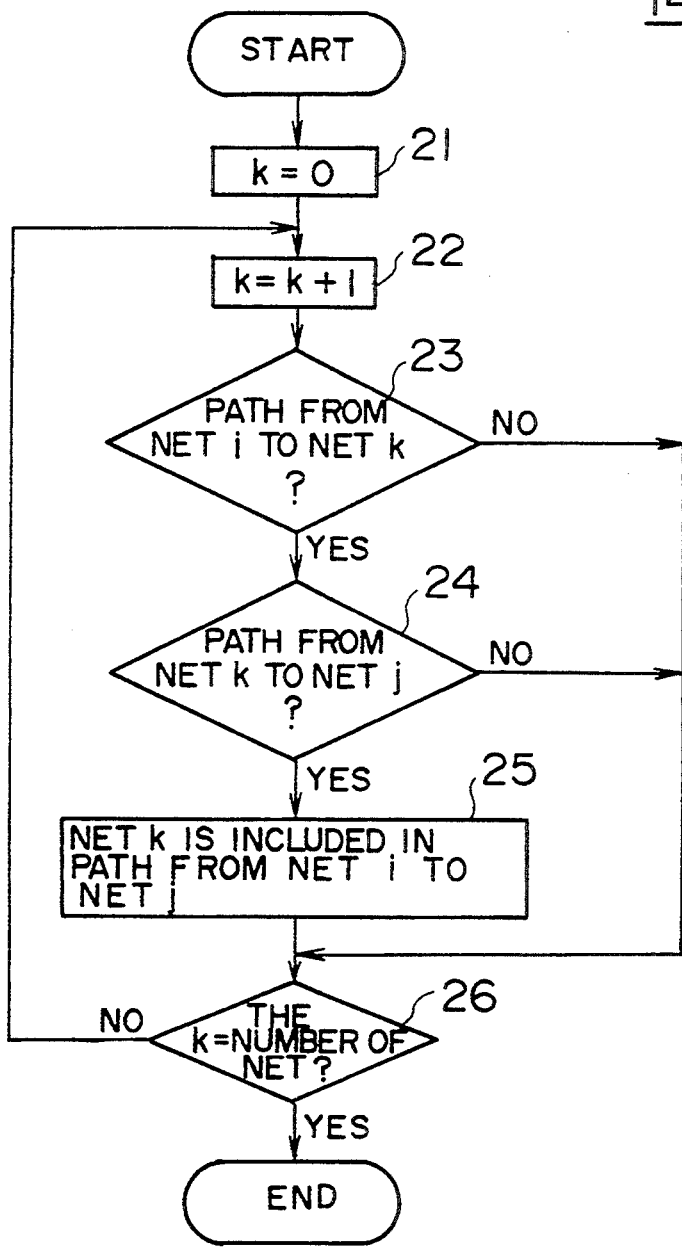
FIG. 27 is a flow chart illustrating detecting nets constituting a signal flow path.

(4) Detecting the nets constructing signal flow path from the start net which is picked up to the end net (step 14): detecting the nets included in the path between the designated start and end nets. The method of detecting a net will be described with reference to FIG. 27. The start and end nets of a signal flow path are represented by i and j, respectively. In accordance with the connection between nets obtained at the above-described process (3), it is checked if there is a signal flow path from the net i to an optical net k (step 23). If there is a signal flow path, it is checked if there is a signal flow path from the net k to net j (step 24). If there is a signal flow path from the net k to net J, the net k is detected as included in the path from the net i to the j (step 25). In the similar manner, the other nets are checked to detect all nets constituting the path from the net i to net j.

(5) Detecting logic gates constituting a signal flow path (step 15): obtaining logic gates connected between the nets constituting the signal flow paths obtained by the above-described process (4) in accordance with the incidence information table for nets and logic gates obtained by the above-described process (2).

(6) Detecting nets connected to logic gate (step 16): obtaining nets connected to the logic gates obtained by the above-described process (4) in accordance with the logic gate level circuit data 3a.

(7) Picking up all elements connected to the nets obtained at step 16 (step 17).

(8). Approximate transformation of elements in an open state (step 18): elements in an open state are connected at the interface net when a subcircuit is picked up. The elements connected at the interface net are replaced with an approximate load. An example of approximate transformation is shown in FIGS. 28a to 28g.

The solid circle symbol 185 indicated at the left side of FIGS. 28a to 28g represents the interface port of a picked-up circuit, and an element between the subcircuit 180 to be simulated and the solid circle 185 is a parasitic element. As shown at the right side of FIGS. 28a to 28g, the information on the connection between elements when the parasitic element is replaced with an approximate load is outputted as the subcircuit data 4. If a similar opened parasitic element exists after the approximate transformation, the approximate transformation shown in FIGS. 28a to 28g is repeatedly applied.

Figure 28A:
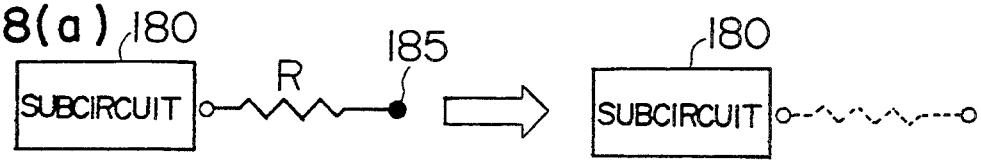
FIG. 28 illustrate an approximate transformation method for an element in an open state connected to a net at the interface port when a subcircuit is picked up.
Figure 28B:
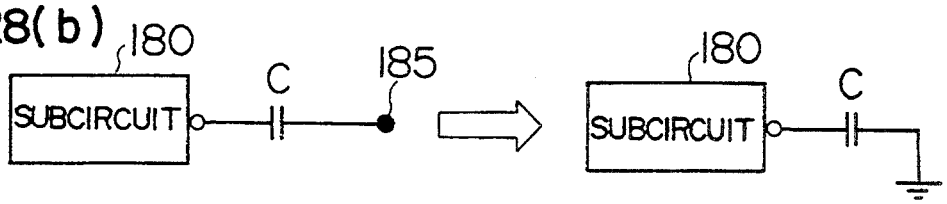
Figure 28C:
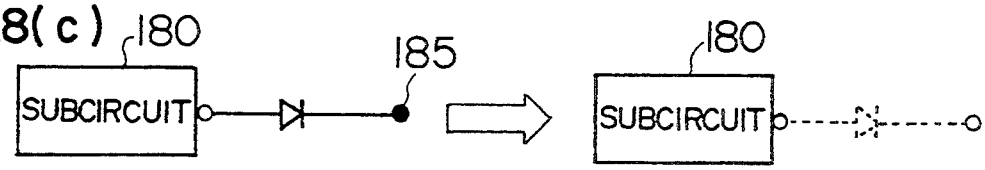
Figure 28D:
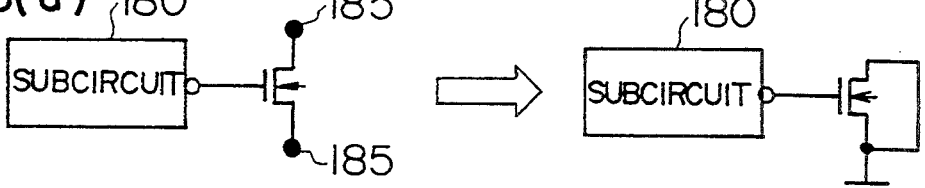
Figure 28E:
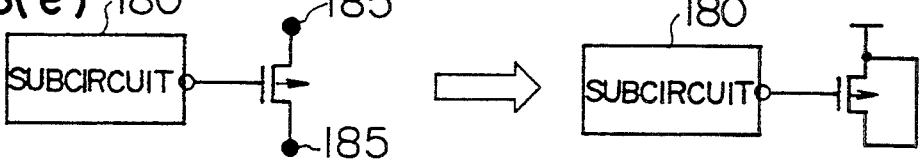
Figure 28F:
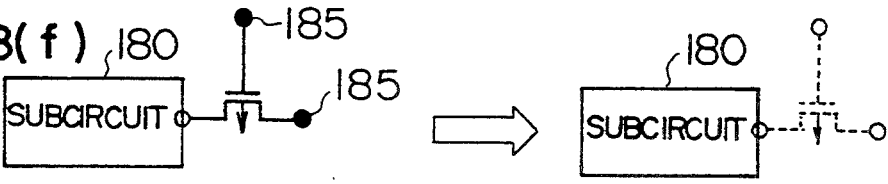
Figure 28G:
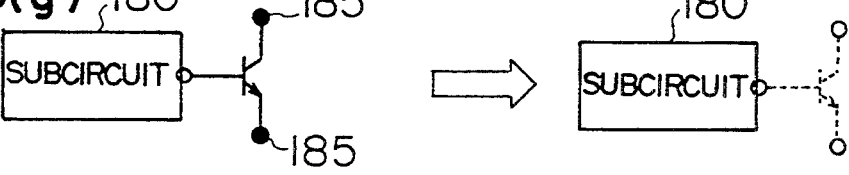

FIG. 28a indicates that a resistor is removed and the picked-up circuit is made open. FIG. 28b indicates that a capacitor is grounded at the terminal not connected to the picked-up circuit. FIG. 28c indicates that a diode is removed and the picked-up circuit is made open. FIG. 28d indicates that the gate of an NMOS transistor is connected to the picked-up circuit, and if the source and drain are not connected to other terminals, they are grounded, to thereby transform the NMOS transistor into a MOS capacitance. FIG. 28e indicates that the gate of a PMOS transistor is connected to the picked-up circuit, and if the source and drain are not connected to other terminals, they are connected to the higher potential power source, to thereby transform the PMOS transistor into a PMOS capacitance. FIG. 28f indicates that if the gate of a MOS transistor is not connected to the picked-up circuit, this MOS transistor is removed and the picked-up circuit is made open. FIG. 28g indicates that a bipolar transistor is removed and the picked-up circuit is made open.

A subcircuit constituting signal paths is picked up in the above manner.

Next, with reference to FIG. 29 showing a circuit diagram, an embodiment will be described for picking up a subcircuit includes in a signal flow path from a net N5 to net N17 with hatching lines. The connection between nets and logic gates shown in FIGS. 52a and 52b and obtained from the logic gate level circuit data is stored in the tables with the format shown in FIGS. 32a and 32b. The table shown in FIG. 32a manages the number of input/output logic gates connected to each net, and the table shown in FIG. 32b manages the identifier for a logic gate connected to each net, the identifier being accessible by the pointer shown in the table of FIG. 32a. In the table shown in FIG. 32a, consider for example the net N9 as an object net. The table indicates that there are one logic gate having as its input the net N9 and one logic gate having as its output the net N9 ($NI_{N9}=1$, $NO_{N9}=1$). With the pointer Pi, the logic gate numbers of two logic gates which are an input logic gate G7 and an output logic gate G3 are stored from the thirteenth row of the table shown in FIG. 32b. The connection between nets and logic gates shown in FIG. 33 is obtained in accordance with the circuit data shown in FIGS. 32a and 32b, and stored in the work file 170. For example, the net N9 is an input to the logic gate G7 so that $a_{G7}$, N9=1 is set in FIG. 33, and the net N9 is an output from the gate G3 so that $a_{G3}$, N9=2 is entered. By repeating such procedure, the incidence information table for nets and logic gates shown in FIG. 33 is formed. In addition, by using the table shown in FIG. 33, for an indirect connection between a net and a logic gate via one or more pairs of a logic gate and net, such as between the net N1 and the logic gate G7 via one pair of the logic gate G3 and net N9, the information $a_{G7}$, N1=1 is added to the table shown in FIG. 33. Solid arrows shown in FIG. 33 indicate a signal flow path from the net N1 to the logic gate G7, and the information indicated by 1 represents the indirect connection between the net and logic gate newly added by tracing the signal flow path. Next, by using the incidence information table for nets and logic gates, the connection and signal flow path direction between nets are obtained. For example, since the net N1 is an input to the logic gate G3 and the net N9 is an output from the logic gate G3, the nets N1 and N9 are connected together and the signal flow path direction is from N1 to N9. Then, $b_{N1}$, N9=1 is entered in the incidence information table for nets shown in FIG. 34. Similar procedure is repeated for other inter-nets to determine the factors for setting values in the incidence information table for nets.

After such processing, nets and logic gates constituting a designated signal flow path are obtained. It is assumed that the start and end nets of the signal flow path are designated, for example, as N5 and N17, respectively indicated with hatching lines in FIG. 29. In this case, in the incidence information table for nets shown in FIG. 34, there is a signal flow path from the net N5 to net N12 ($b_{N5}$, N12=1) and also a signal flow path from the net N12 to net N17 ($b_{N12}$, N17=1), so that the net N12 is judged as the net constituting the designated signal flow path. In the similar manner, all nets N5, N8, N12, N15 and N17 constituting the signal flow path are obtained. This signal flow path is indicated at the bold line in FIG. 30. Next, logic gates interposed between these nets are obtained. Specifically, by using the incidence information table for nets and logic gates, the logic gates (G2, G6, G8 and G10) having as their input/output one of the obtained nets are obtained. These logic gates are indicated by logic symbols * in FIG. 30. After all nets (N5, N6, N8, N10, N12, N14, N15 and N17) connected to the logic gates indicated by * are obtained, all elements and logic gates indicated by * included within these nets are picked up. Lastly, the elements in an open state connected to the nets N10 and N14 at the interface port undergo the processing shown in FIG. 28. The state after the pickup is shown in FIG. 31.

Figure 35:
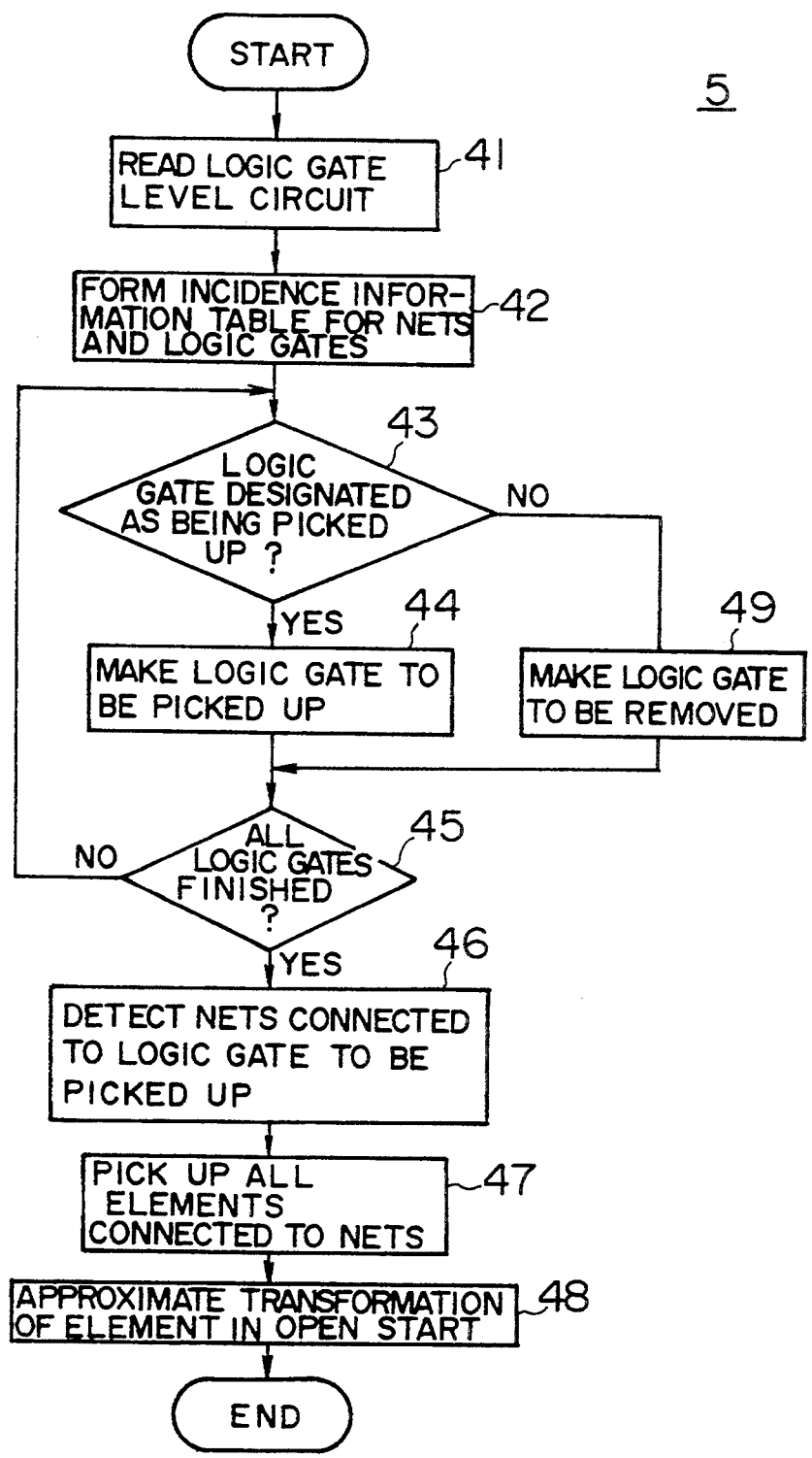
FIG. 35 is a flow chart illustrating picking up a subcircuit on the logic gate unit basis.

Next, the procedure for picking up a subcircuit on the logic gate unit basis will be described with reference to FIG. 35. This method is constructed of the following steps.

(1) Reading circuit data (step 41): reading the logic gate level circuit data 3a generated through extraction from the layout pattern 1.

(2) Generating an incidence information table for nets and logic gates (step 42): generating an incidence information table for nets and logic gates directly connected together in accordance with the circuit data 3a.

(3) Checking a logic gate (step 43): checking whether or not a logic gate in concern has been designated as the logic gate to be picked up.

(4) Picking up a logic gate (steps 43, 44, 49 and 45): if a logic gate in concern has been designated as the logic gate to be picked up, it is designated as the object logic gate to be picked up (step 44), and if not, the logic gate in concern is removed (step 49).

(5) Picking up a net to be connected (step 46): detecting a net connected to the logic gate to be picked up.

(6) Picking up all elements connected to the net detected at step 46 (step 47).

(7) Approximate transformation of an element in an open state (step 48): an element in an open state connected to the picked-up net is replaced with an approximate load.

Figure 36:
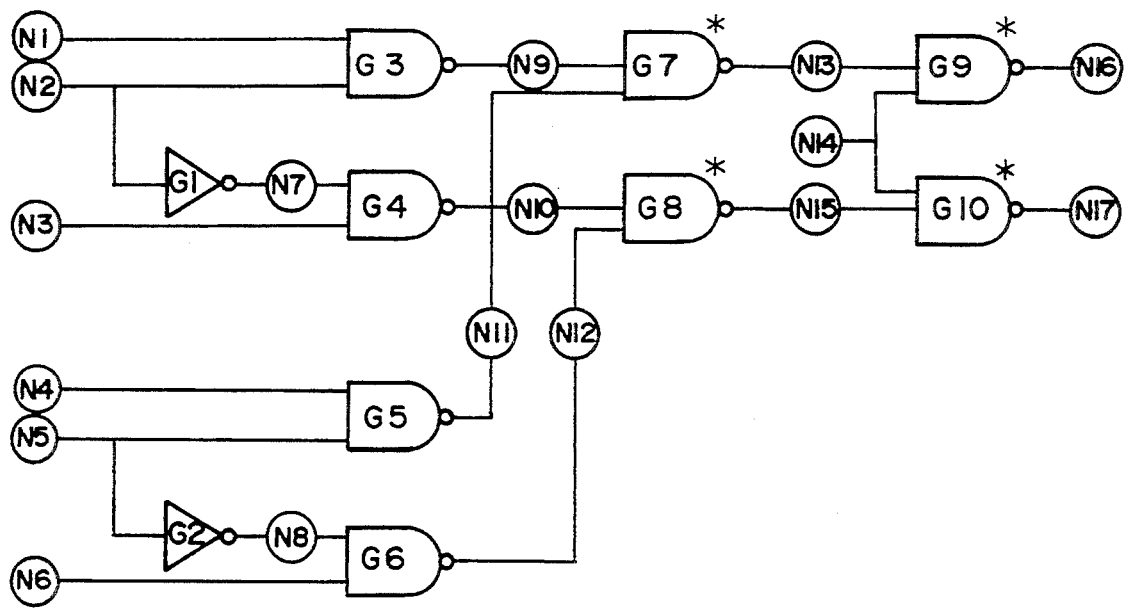
Figure 37:
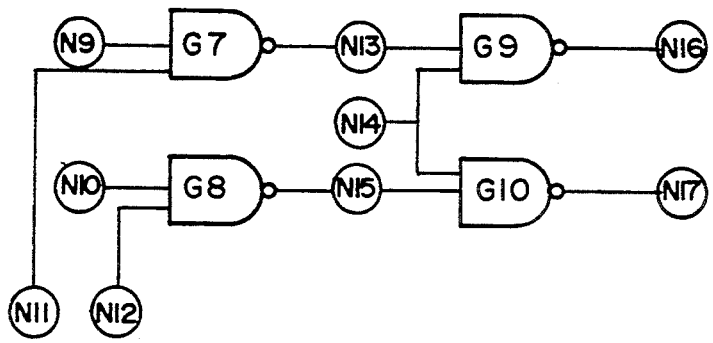
FIG. 37 is a circuit diagram illustrating that logic gates are designated and picked up.

With reference to the circuit diagram shown in FIG. 36, an embodiment will be described for picking up a subcircuit on the logic gate unit basis. The circuit shown in FIG. 36 is the same as the circuit shown in FIG. 29. Accordingly, the circuit data shown in FIGS. 32a and 32b and the incidence information table for nets and logic gates shown in FIG. 33 can be used. It is assumed that logic gates G7, G8 and G10 with * symbols in FIG. 36 are designated as the logic gates to be picked up. First, nets connected to the logic gates G7, G8, G9 and G10 are obtained from the incidence information table for nets and logic gates shown in FIG. 33. Next, all parasitic elements and logic gates with a symbol within these nets are picked up. The elements in an open state at the interface nets (N9, N10, N11 and N12) undergo the processing shown in FIGS. 28a to 28g. The state after pickup processing is shown in FIG. 37.

Figure 38:
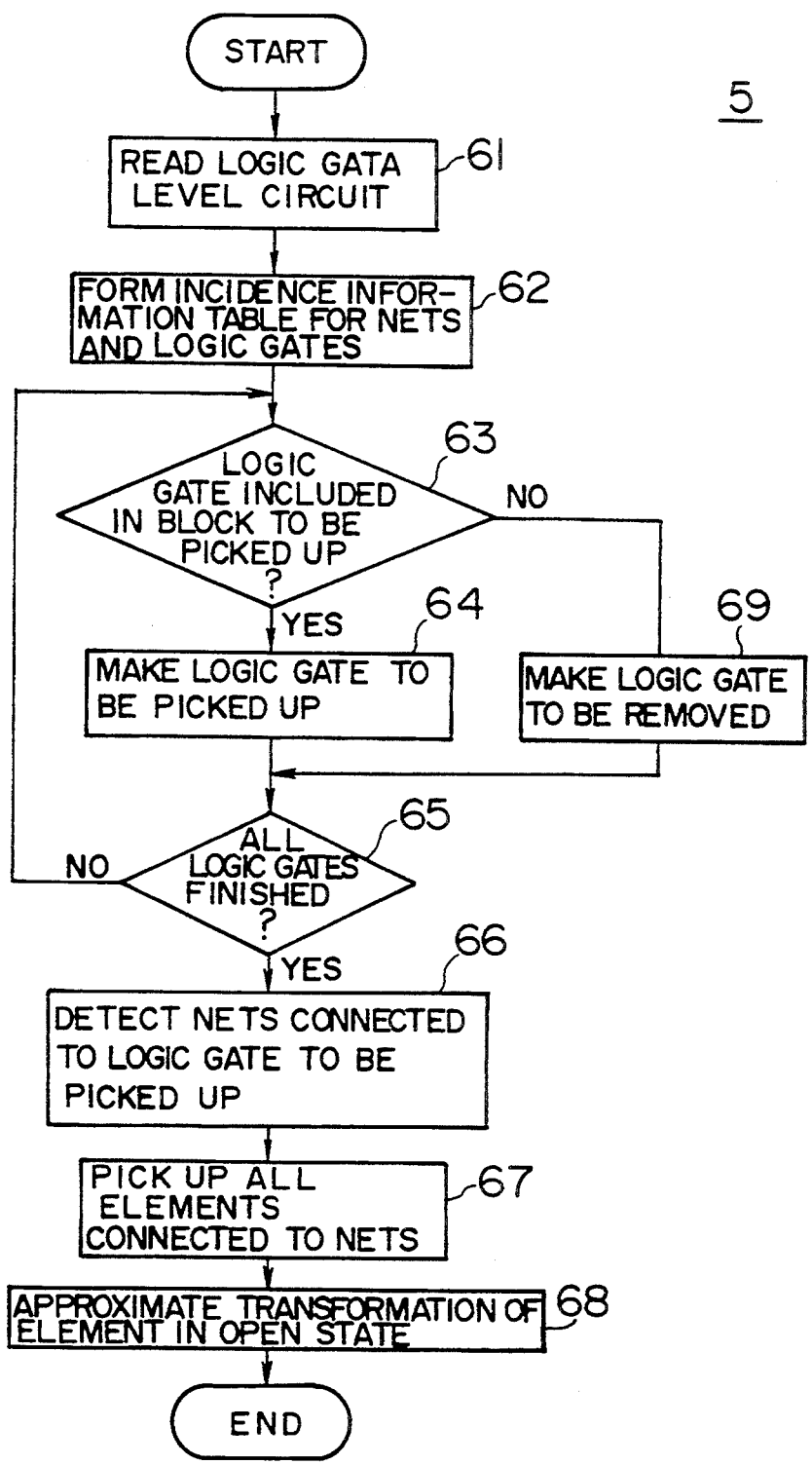
FIG. 38 is a flow chart illustrating picking up a subcircuit on the block unit basis.

Next, with reference to FIG. 38, the procedure will be described for picking up a subcircuit belonging to a block which has been designated as a simulation object. This method is constructed of the following steps.

(1) Reading circuit data (step 61): reading the logic gate level circuit data 3a generated through extraction from the layout pattern 1.

(2) Generating an incidence information table for nets and logic gates (step 62): generating an incidence information table for nets and logic gates directly connected together in accordance with the circuit data 3a.

(3) Checking a logic gate (step 63): checking whether or not a logic gate in concern is present within the designated block.

(4) Picking up a logic gate unit (steps 64, 69 and 65): if a logic gate in concern is present within the designated block, it is designated as the object logic gate to be picked up (step 64), and if not, the logic gate in concern is removed (step 69).

Steps 63, 64 and 69 are repeated for all logic gates (step 65).

(5) Detecting a net connected to a logic gate (step 66): detecting a net connected to the logic gate to be picked up.

(6) Picking up all elements connected to the net detected at step 66 (step 67).

(7) Approximate transformation of an element in an open state (step 68): an element in an open state connected to the picked-up net is replaced with an approximate load.

Figure 39:
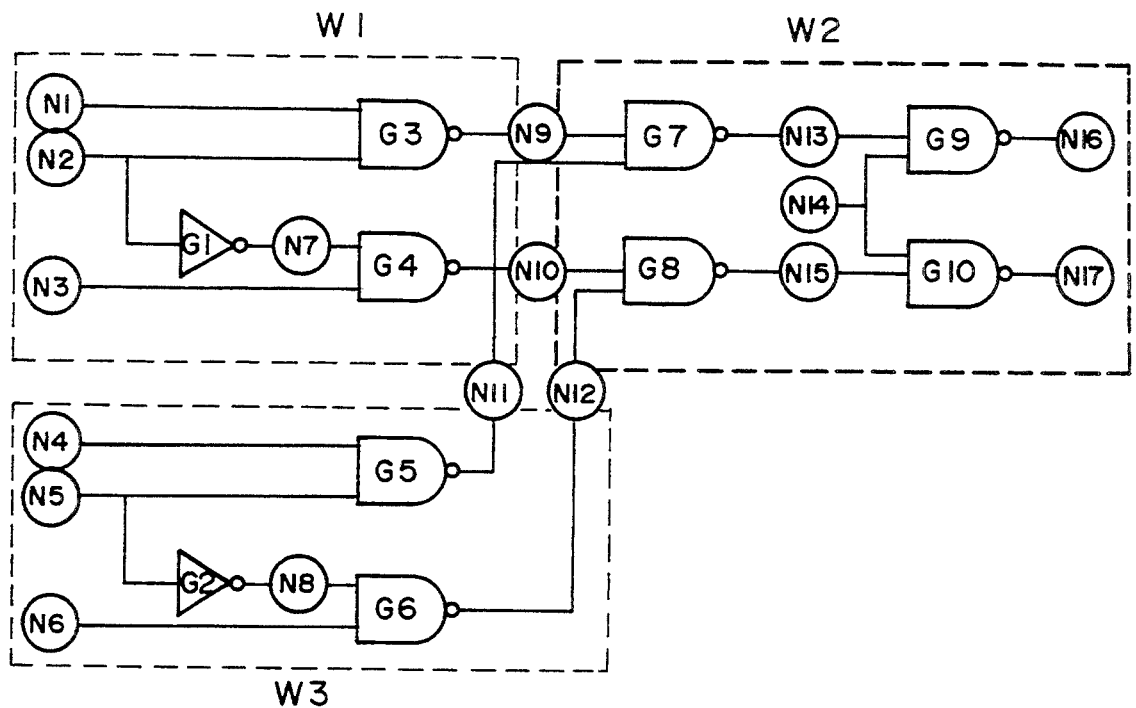
Figure 40:
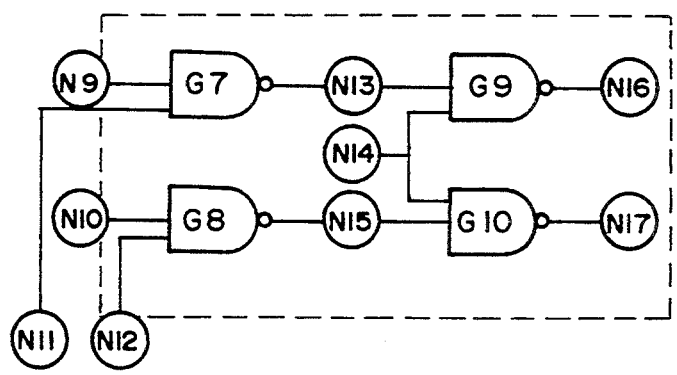
FIG. 40 is a circuit diagram illustrating that blocks are designated and picked up.

With reference to the circuit diagram shown in FIG. 39, this embodiment will be described. The circuit shown in FIG. 39 is divided into three blocks (W1, W2 and W3) and is the same circuit as the circuit shown in FIG. 29. Accordingly, the circuit data shown in FIGS. 32a and 32b and the incidence information table for nets and logic gates shown in FIG. 33 can be used. It is assumed that a block W2 indicated by a bold broken line in the circuit of FIG. 39 is designated. The circuit portions indicated by a fine broken line are the other blocks W1 and W3. Nets connected to the logic gates G7, G8, G9 and G10 belonging to the block W2 are obtained from the incidence information table for nets and logic gates shown in FIG. 33. Next, all parasitic elements and logic gates of the window 2 within these nets are picked up. The elements in an open state at the interface nets (N9, N10, N11 and N12) undergo the processing shown in FIGS. 28a to 28g. The state after pickup processing is shown in FIG. 40.

Lastly, an embodiment will be described wherein after the circuit shown in FIG. 29 is divided into functional blocks, and a subcircuit constituting a signal flow path passing through a plurality of blocks.

Figure 41:
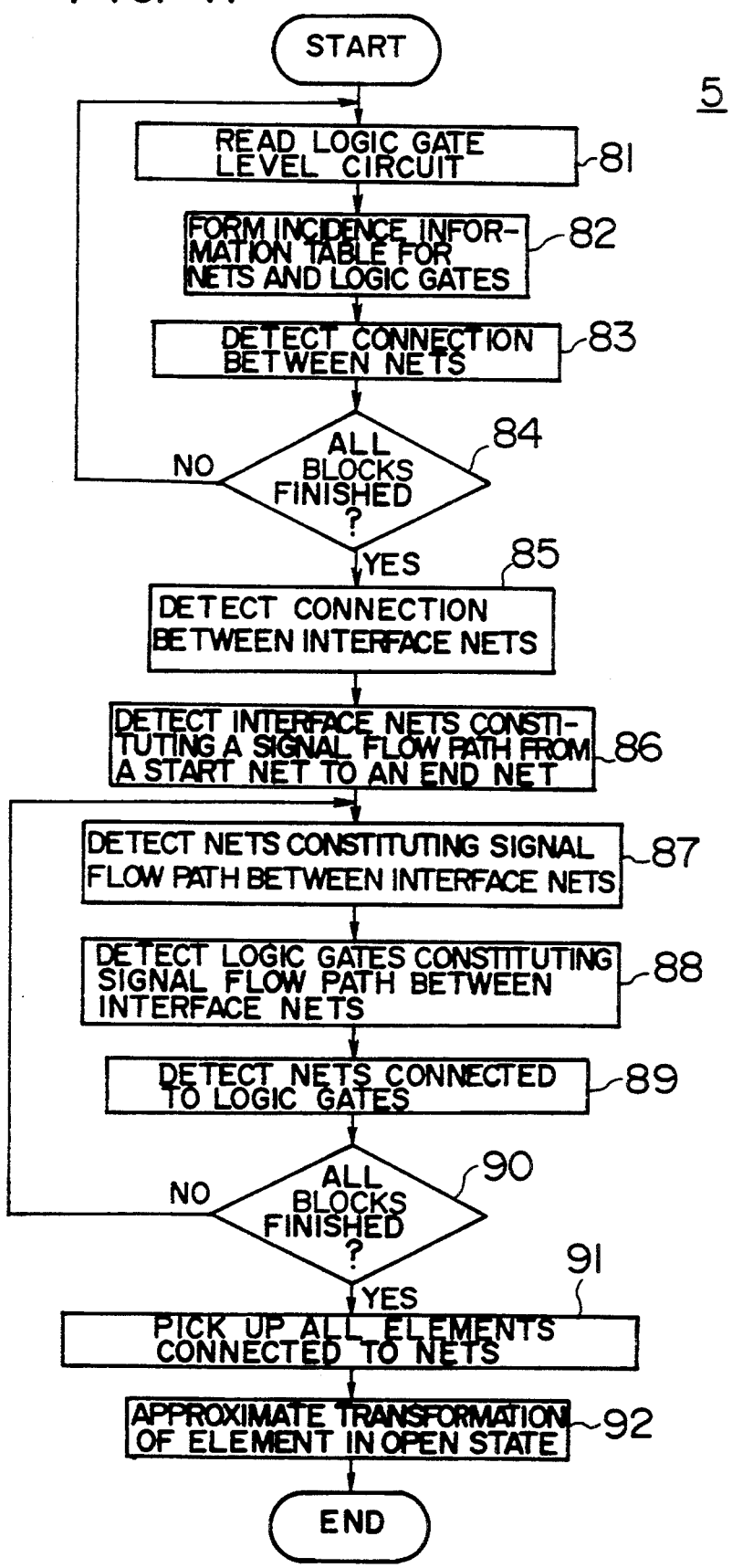
FIG. 41 is a flow chart illustrating picking up a subcircuit on the signal flow path unit basis by using hierarchical circuit data.

In order to reduce a computer memory capacity used for circuit extraction processing and circuit simulation for a large scaled circuit, it is effective if the circuit data structure is made hierarchical. For example, as shown in FIG. 39, the entire circuit is divided into three blocks W1, W2 and W3 to thereby make it hierarchical. With the hierarchical circuit data structure, it is possible to pick up a subcircuit constituting a designated signal flow path by using the following method. The procedure for this method will be described with reference to FIG. 41.

(1) Reading circuit data (step 81): reading the logic gate level circuit data 3a generated through extraction from the layout pattern 1.

(2) Generating an incidence information table for nets and logic gates (step 82): generating an incidence information table for nets and logic gates by obtaining the connection between all nets and logic gates in accordance with the circuit data 3a, for each block which is a set of logic gates in the hierarchical circuit data 3a.

(3) Detecting the connection between nets (step 83): detecting the connection and signal flow path direction between two nets for each block in accordance with the connection between nets and logic gates.

Steps 81, 82 and 83 are repeated for all blocks (step 84).

(4) Detecting the connection between interface nets (step 85): detecting the connection and signal flow path direction between interface nets which interconnect different blocks, in accordance with the connection between nets.

(5) Detecting the connection between interface nets (step 86): detecting interface nets included in a signal path flow to be picked up and identified by designating the start and end nets thereof.

(6) Detecting the connection between nets (step 87): detecting nets constituting the signal path between interface nets obtained by the above-described process (5).

(7) Detecting logic gates constituting a signal flow path (step 88): obtaining logic gates connecting between nets constituting the signal flow path obtained by the above-described process (6), in accordance with the connection between nets and logic gates obtained by the above-described process (2).

(8) Detecting nets connected to logic gates (step 89): obtaining nets connected to logic gates obtained by the above-described process (4) in accordance with the logic gate level circuit data 3a.

Steps 87, 88 and 89 are represented for all the blocks (step 90).

(9) Picking up elements (step 91): picking up all elements connected to nets.

(10) Approximate transformation of elements in an open state (step 92): elements in an open state connected to picked-up nets are replaced with an approximate load.

Figure 42:
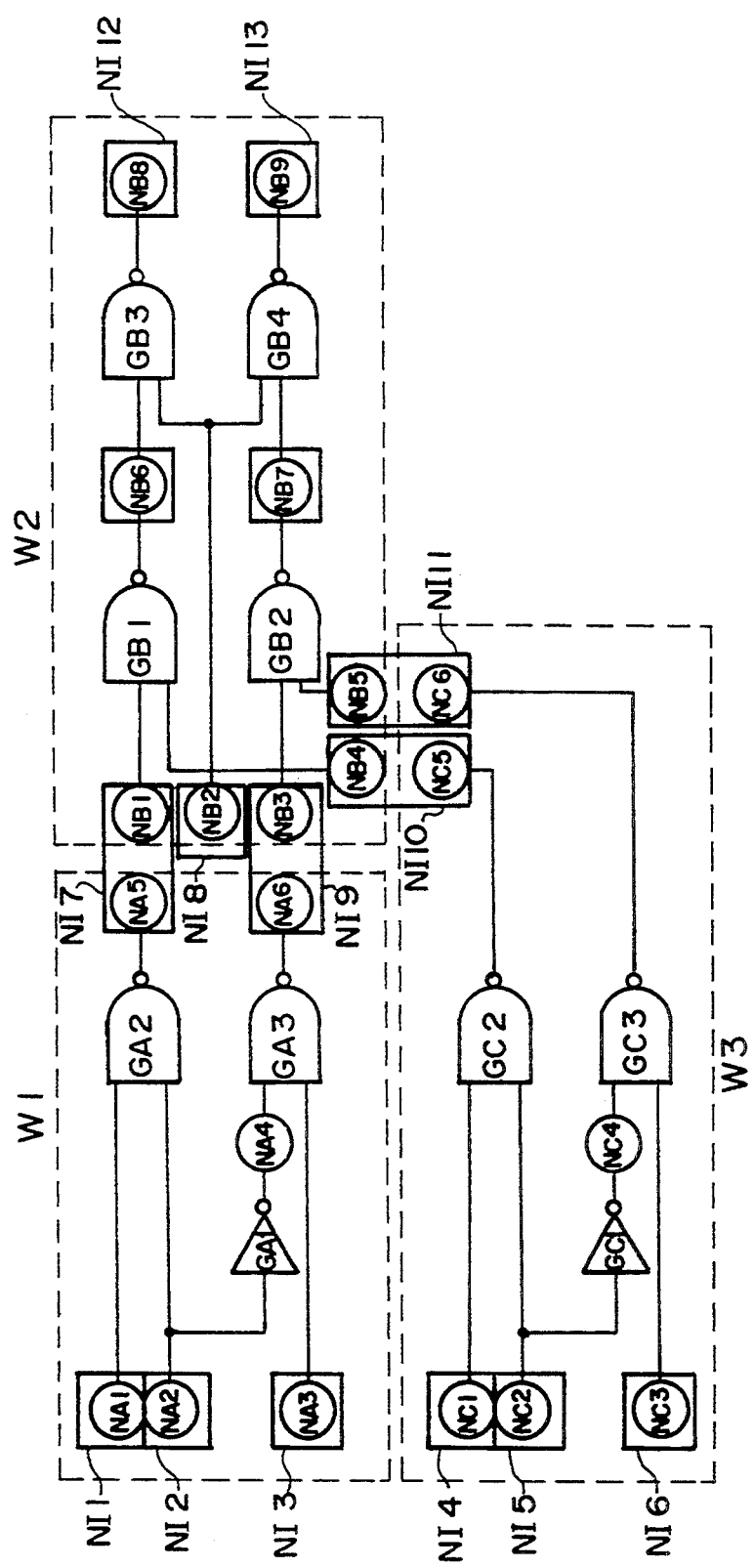

Next, with reference to the circuit constructed of three blocks shown in FIG. 42, there will be described a method of picking up a subcircuit constituting a signal flow path from a net NC2 within the block W3 to a net NB8 within the block W2. The circuit data of each block extracted from a layout pattern is stored in the tables shown in FIGS. 43(a1) to 43(a3) in accordance with the circuit data, the connection between all logic gates and nets for each block is obtained. The incidence information table for nets and logic gates similar to the table shown in FIGS. 32a and 32b is formed. In accordance with the obtained incidence information table for nets and logic gates, the connection between nets within each block is obtained to thereby form tables shown in FIG. 44. In accordance with the obtained incidence information tables for nets and logic gates, the connection between nets within each block is obtained, and the incidence information table for nets shown in FIG. 45 is made. Next, in accordance with the incidence information table for nets, the correspondence between nets within each block and interface nets interconnecting blocks is obtained as shown in FIG. 49. For example, an interface net NI7 shown in FIG. 49 corresponds to a net NA5 for the block W1, and to a net NB1 for the block W2. By using FIG. 49 and FIG. 45, there is formed an incidence information table for interface nets as shown in FIG. 46. Next, there are obtained interface nets (NI5, NI13) corresponding to the start net (NC2) and end net (NB8) of a signal flow path to be picked up, and there are obtained interface nets (NI5, NI11, NI13) of a signal flow path from NI5 to NI13. Nets constituting the signal path between obtained interface nets are obtained for each block. For example, in the block W3, there is included a signal flow path from NI5 to NI11 so that obtained are nets (NC2, NC4, NC6) constituting a signal flow path from the net NC2 included by NI5 to the net NC6 included by NI11. Next, logic gates (GC1, GC3) interposed between these nets are obtained in accordance with the incidence information table for nets and logic gates. Then, nets (NC2, NC3, NC4, NC6) connected to the obtained logic gates are obtained.

Figure 47:
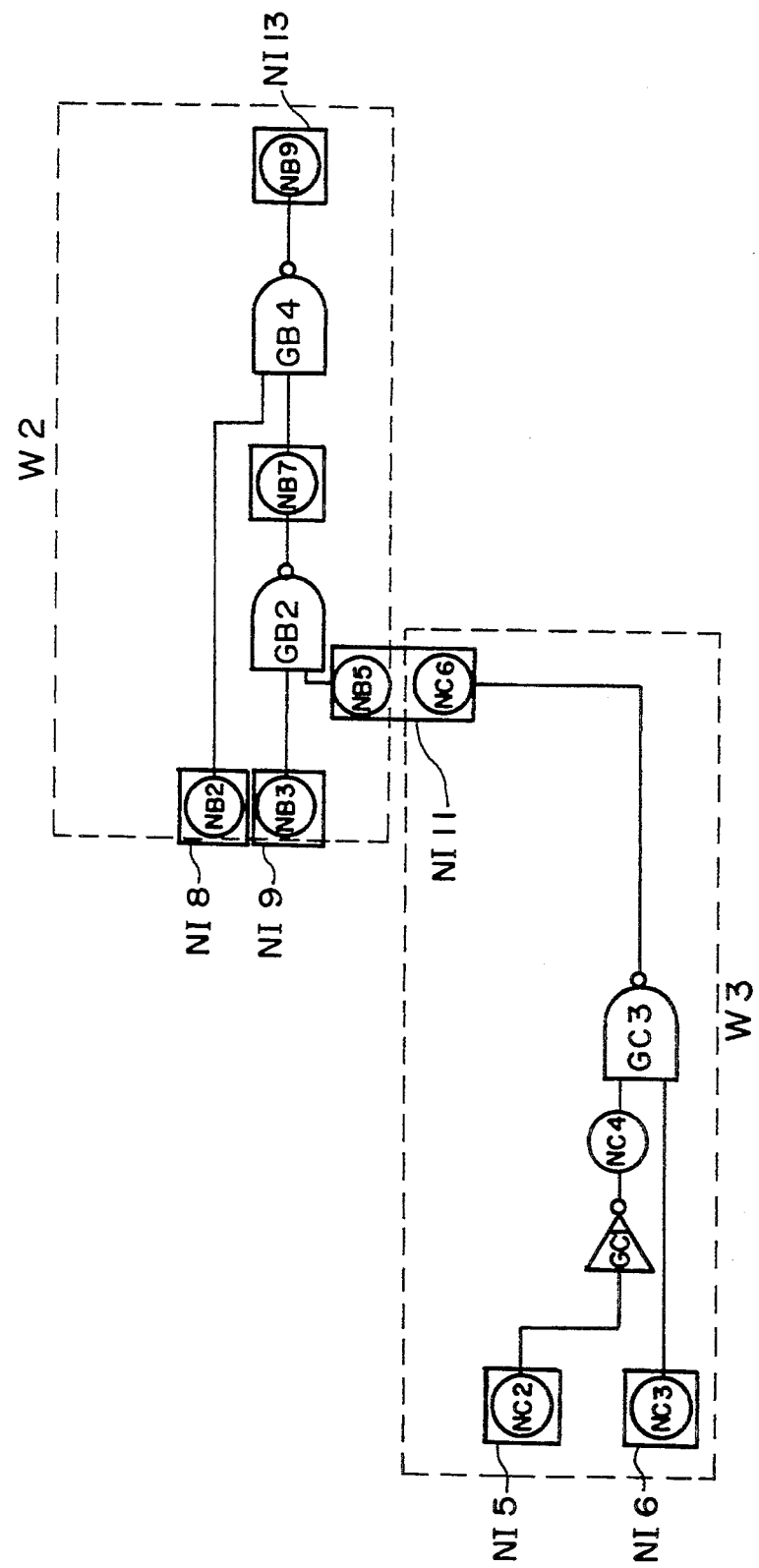

In the similar manner, for the block W2, nets and logic gates constituting the signal flow path from the interface net NI11 to interface net NI13 are obtained. Finally, elements in an open state connected to the nets at interface ports of the picked-up circuit are replaced with approximate loads. The state after pickup processing is shown in FIG. 47.

In the above manner, a subcircuit constituting a signal path is picked up in accordance with the hierarchical circuit data.

In order to reduce the memory capacity used in pickup processing when the method of this invention is applied to a large scaled circuit, a matrix shown in FIGS. 48a and 48b may be used instead of the matrix shown in FIG. 34. For example, there are four nets ($Ci=4$) connected to a signal flow path from the net N1. The numbers of these four nets are N1, N9, N13 and N16 stored at the first row ($Pi=1$) shown in the table of FIG. 48b.

Figure 50:
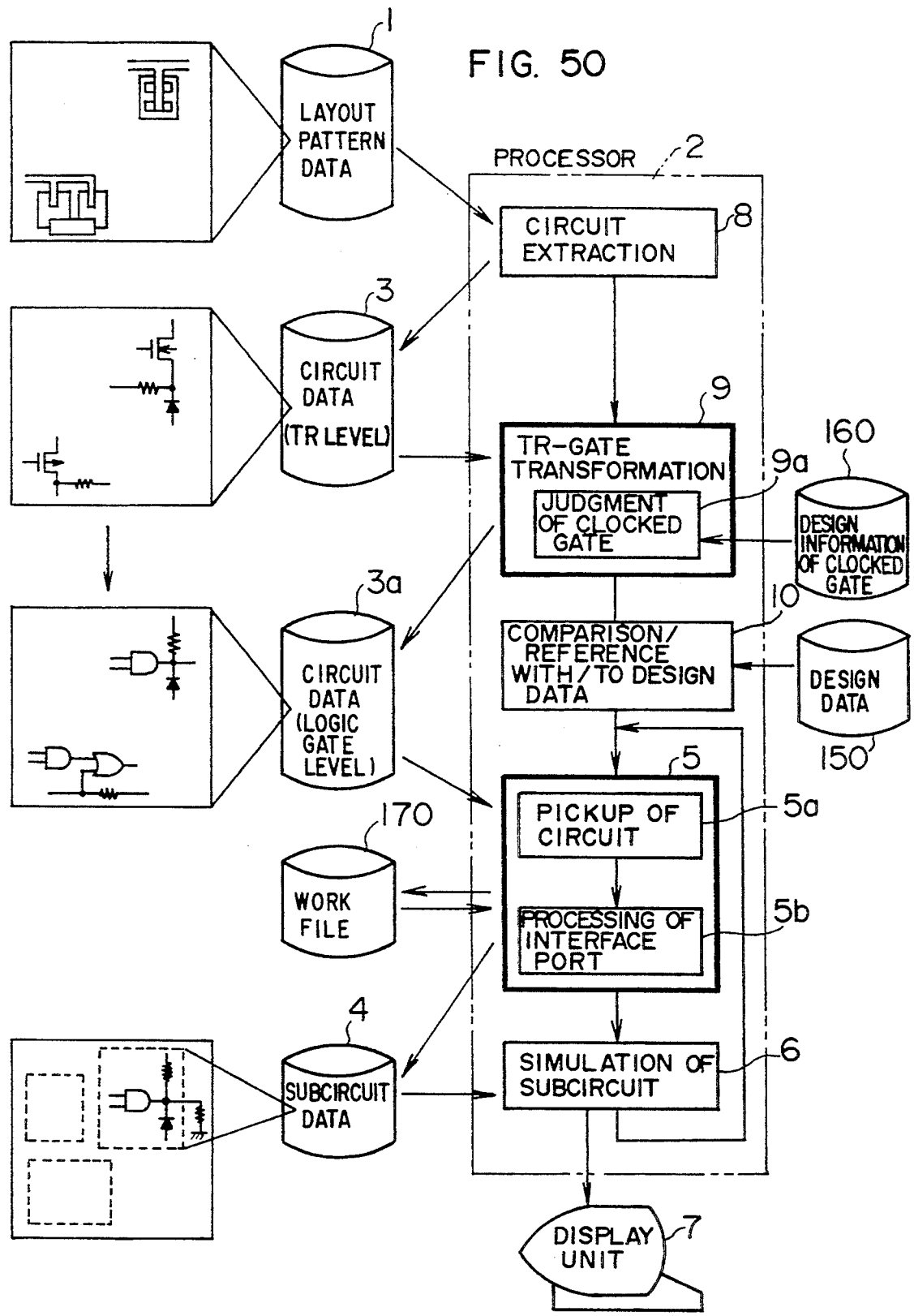
FIG. 50 is a block diagram illustrating the entirety of programs according to another embodiment of this invention.

In the embodiment shown in FIG. 50, the comparison/reference processing 10 of the logic gate level circuit data 3a with/to the design data 150 is added to the embodiment shown in FIG. 1. Specifically, prior to the pickup processing 5 of the logic gate level data 3a, it is verified whether or not the logic gate level circuit data 3a generated at the processing 9 is representative of the design data 150 from which the layout pattern 1 was formed. At the processing 10, parasitic elements derived from the layout pattern 1 are not verified, but logic gate level is verified.

A subcircuit a generated by the above-discussed circuit pickup processing 5 is a sum of the transistor level circuit data and the logic gate level circuit data. Therefore, either the circuit element level or the logic gate level can be simulated.

According to the verification method for a layout pattern of this invention, the whole layout pattern is transformed into a circuit data and a subcircuit necessary for simulation is picked up so that correspondence between the layout pattern and the circuit is not necessary. An approximate load is added to the interface port of the picked-up subcircuit so that a high precision simulation is possible.

Furthermore, when the transistor level circuit data is transformed into the logic gate level circuit data, the clocked gate is detected so that a subcircuit can be efficiently picked up while considering not only logic gates but also clocks.

We claim:

1. A method for determining a circuit portion to be simulated within a first circuit of a transistor level, comprising the steps, of:

selecting part of a second circuit of a logic gate level, represented by the first circuit; and detecting a subcircuit of the first circuit which is required for circuit simulation involving the selected part of the second circuit, wherein the steps of selecting and detecting are executed by an apparatus.

2. A method according to claim 1, wherein the selecting step includes selecting, as said part of said second circuit, logic gates which should b involved in circuit simulation, wherein the detecting step includes detecting both internal elements which form the selected gates and external elements, each of which is connected to one of the internal elements.

3. A method according to claim 2, wherein the detecting step further includes determining, for each external element, an approximate element of a transistor level, which is to be used so as to replace said each external element.

4. A method according to claim 3, wherein the determining step includes the step of determining whether no approximate element is to be used in place of each external element.

5. A method according to claim 1, wherein the selecting step includes:

detecting, as logic gates which form the selected part of said second circuit, logic gates connected to a signal path from a start net to an end net both selected for simulation among nets within the second circuit.

6. A method according to claim 1, wherein the detecting step includes:
   detecting, as logic gates which form the selected part of said second circuit, logic gates included in one block selected for simulation within a plurality of blocks of which the second circuit is comprised.

7. A method according to claim 1, further comprising the step of detecting the second circuit from data representative of the first circuit, before execution of the detecting step.

8. A method according to claim 7, further comprising the step of extracting the first circuit from data representative of an LSI mask pattern.

9. A circuit simulation method for a circuit represented by an LSI layout pattern, comprising the steps, of:
   a) extracting a first circuit of a transistor level from said layout pattern, based upon data representing said layout pattern;
   b) detecting a second circuit of a logic gate level represented by said first circuit;
   c) selecting part of said second circuit for selected circuit simulation;
   d) picking up a subcircuit within said first circuit which is comprised of elements within the first circuit required for circuit simulation involving said selected part of said second circuit; and
   e) performing circuit simulation on said subcircuit within the first circuit;
   wherein the steps of extracting, detecting, selecting, picking up a subcircuit and performing circuit simulation are executed by an apparatus.

10. A method according to claim 9, wherein said step c) comprises:
   c1) detecting nets constituting a signal flow path within said second circuit from a start net to an end net; and
   c2) detecting logic gates constituting said signal flow path, as ones which form the selected part of said second circuit;
   wherein said step d) includes:
   d1) detecting nets each connected to one of said gates detected at said step c1), as ones which form the subcircuit of the first circuit.

11. A method according to claim 9,
   wherein said step c) comprises selecting part of logic gates included in the second circuit, as ones which form the selected part of said second circuit, and
   wherein said step d) includes:
   d1) detecting nets connected to said selected logic gates; and
   d2) picking up elements connected to said detected nets, as ones which form the subcircuit of the first circuit.

12. A method according to claim 9, wherein said second circuit is comprised of a plurality of blocks,
   wherein said step c) comprises detecting logic gates included in one of the blocks, as ones which form the selected part of said second circuit; and
   wherein said step d) comprises:
   d1) detecting nets each connected to one of the detected logic gates; and
   d2) picking up elements each connected to one of said detected nets, as ones which form the subcircuit of said first circuit.

13. A method according to claim 9, wherein said second circuit is comprised of a plurality of blocks, wherein said step c) comprises:
   c1) detecting connection between interface nets interconnecting respective blocks;
   c2) detecting interface nets constituting a signal flow path from a start net to an end net;
   c3) detecting nets constituting a signal flow path between interface nets for each block; and
   c4) detecting logic gates constituting said signal flow path detected at said step c3) for each block, as logic gates which form said selected part of said second circuit;
   wherein said step d) further comprises:
   d1) detecting nets connected to said logic gates detected at said step c4) for each block; and
   d2) picking up elements each connected to one of said nets detected at step d1) for different blocks, as elements which form the subcircuit of said first circuit.

14. A method according to claim 9, further comprising the step of:
   comparing, between the steps b) and c), said detected second circuit with design data representing said layout pattern.

15. A method according to claim 9,
   wherein the selecting step c) includes selecting logic gates within the second circuit which form the part of said second circuit;
   wherein the picking-up step d) includes:
   d1) detecting, as elements to form the subcircuit of the first circuit, elements within the first circuit, each element being connected to one of elements within said first circuit which form the selected logic gates.

16. A method according to claim 15, wherein the picking-up step d) further includes:
   d2) detecting picked-up elements, each of which has one terminal not connected to other of the picked-up elements; and
   d3) determining an approximate element of a transistor circuit level to be used in place of each of said picked-up elements as detected by said step d2).

17. A method according to claim 16, wherein the determining step d3) includes the steps of:
   detecting whether each element acts substantially as a capacitive element or a resistive element;
   selecting a capacitor as an approximate element to replace one of said elements as detected at step d2), in case said one element has been detected as one acting as a capacitive element, and selecting no approximate element in case said element has been detected as one acting as a resistive element, in conjunction with disconnecting said one element from said subcircuit.

18. A method according to claim 15, wherein said determining step includes the step of not using an approximate element for one of the external elements if the one external element is a resistor, with said resistor being disconnected from said subcircuit.

19. A method according to claim 15, wherein said determining step includes the step of not using any approximate element for one of the external elements, if one of the external elements is a diode, with said diode being kept at a predetermined potential.

20. A method according to claim 15, wherein said determining step includes the step of using said one external element as an approximate element therefor, if the one external element is an MOS transistor with a gate connected to the picked-up subcircuit, and with a source and a drain of said MOS transistor being kept at a predetermined potential to form a capacitance.

21. A method according to claim 20, wherein said predetermined potential is set to a potential of a ground or a high potential power source, depending upon whether the MOS transistor is of an N type or P type.

22. A method according to claim 15, wherein said determining step includes the step of not using any approximate element for one of the external element, if one of the external element is a MOS transistor with a drain or a source being connected to said subcircuit and a gate thereof being not connected to the picked-up subcircuit, with said MOS transistor being kept at a predetermined potential.

23. A method according to claim 15, wherein said determining step includes the step of using said one external element as an approximate element therefor, with a terminal of said capacitor not connected to said subcircuit being kept at a predetermined potential.

24. A method according to claim 15, wherein said determining step includes the step of not using any approximate element for one of the external element, if one of the external element is a bipolar transistor, with said bipolar transistor being kept at a predetermined potential.

25. A method according to claim 9,
wherein the picking-up step d) includes:
d1) picking up both internal elements and external elements within the first circuit as elements to form the subcircuit of the first circuit, each internal element being an element forming one of logic gates located inside of the part of the second circuit, each external element being an element forming a logic gate located outside of the part of the second circuit and being connected to one of the internal elements.

26. A method according to claim 25, wherein the picking-up step d) further includes:
d2) replacing each of the external elements by an approximate element of a transistor circuit level or deleting one of the external elements without adding an approximate element in place of the one external element.

* * * * *